(12) United States Patent
Greene et al.

(10) Patent No.: US 10,256,822 B2
(45) Date of Patent: Apr. 9, 2019

(54) FRONT TO BACK RESISTIVE RANDOM ACCESS MEMORY CELLS

(71) Applicant: Microsemi SoC Corp., San Jose, CA (US)

(72) Inventors: Jonathan Greene, Palo Alto, CA (US); Frank Hawley, Campbell, CA (US); John McCollum, Orem, UT (US)

(73) Assignee: Microsemi SoC Corp., San Jose, CA (US)

( * ) Notice: Subject to any disclaimer, the term of this patent is extended or adjusted under 35 U.S.C. 154(b) by 0 days.

(21) Appl. No.: 15/956,692

(22) Filed: Apr. 18, 2018

(65) Prior Publication Data

US 2018/0241398 A1 Aug. 23, 2018

Related U.S. Application Data

(62) Division of application No. 14/621,139, filed on Feb. 12, 2015, now Pat. No. 9,147,836, which is a division
(Continued)

(51) Int. Cl.
*H03K 19/177* (2006.01)
*H01L 27/24* (2006.01)
*H01L 45/00* (2006.01)

(52) U.S. Cl.
CPC ..... *H03K 19/1776* (2013.01); *H01L 27/2436* (2013.01); *H01L 27/2463* (2013.01);
(Continued)

(58) Field of Classification Search
CPC ............ H01L 51/0072; H01L 51/5072; H01L 51/5056; H01L 51/56; C09K 11/06
(Continued)

(56) References Cited

U.S. PATENT DOCUMENTS 4,758,745 A 7/1988 Elgamal et al.
4,873,459 A 10/1989 Gamal et al.
(Continued)

OTHER PUBLICATIONS

PCT/US2016/066955, Notification of Transmittal of The International Search Report and The Written Opinion of the International Searching Authority, or the Declaration, Form PCT/ISA/220.
(Continued)

*Primary Examiner* — Andy Huynh
(74) *Attorney, Agent, or Firm* — Glass & Associates; Kenneth D'Alessandro; Kenneth Glass

(57) ABSTRACT

A resistive random-access memory device formed on a semiconductor substrate includes an interlayer dielectric formed over the semiconductor substrate and includes a first via. A chemical-mechanical-polishing stop layer is formed over the interlayer dielectric. A lower metal layer formed in the first via presents a substantially planar top surface. A dielectric layer is formed over the chemical-mechanical-polishing stop layer and is in electrical contact with the lower metal layer. A barrier metal layer is formed over the dielectric layer. Edges of the dielectric layer and the first barrier metal layer form an aligned stack having edges extending beyond outer edges of the first via. A dielectric barrier layer including a second via is formed over the aligned stack and at least a portion of the chemical-mechanical-polishing stop layer. An upper metal layer formed in the second via in electrical contact with the barrier metal layer.

23 Claims, 15 Drawing Sheets

Related U.S. Application Data of application No. 14/274,417, filed on May 9, 2014, now Pat. No. 8,981,328, which is a division of application No. 13/840,815, filed on Mar. 15, 2013, now Pat. No. 8,723,151, which is a division of application No. 12/829,311, filed on Jul. 1, 2010, now Pat. No. 8,415,650, application No. 15/956,692, filed on Apr. 18, 2018, which is a division of application No. 14/835,928, filed on Aug. 26, 2015, now Pat. No. 9,991,894.

(60) Provisional application No. 61/222,708, filed on Jul. 2, 2009.

(52) U.S. Cl.
CPC .......... *H01L 45/085* (2013.01); *H01L 45/122* (2013.01); *H01L 45/1233* (2013.01); *H01L 45/1253* (2013.01); *H01L 45/1266* (2013.01); *H01L 45/141* (2013.01); *H01L 45/142* (2013.01); *H01L 45/149* (2013.01); *H01L 45/1616* (2013.01); *H01L 45/1625* (2013.01); *H01L 45/1675* (2013.01); *H03K 19/17724* (2013.01); *Y10S 438/90* (2013.01)

(58) Field of Classification Search
USPC ...................................................... 257/72, 5
See application file for complete search history.

(56) References Cited

U.S. PATENT DOCUMENTS

| | | |
|---|---|---|
| 4,904,338 A | 2/1990 | Kozicki |
| 5,229,963 A | 7/1993 | Ohtsuka et al. |
| 5,254,866 A | 10/1993 | Ogoh |
| 5,314,772 A | 5/1994 | Kozicki et al. |
| 5,463,583 A | 10/1995 | Takashina |
| 5,500,532 A | 3/1996 | Kozicki |
| 5,537,056 A | 7/1996 | McCollum |
| 5,542,690 A | 8/1996 | Kozicki |
| 5,557,137 A | 9/1996 | Cohen |
| 5,576,568 A | 11/1996 | Kowshik |
| 5,587,603 A | 12/1996 | Kowshik |
| 5,625,211 A | 4/1997 | Kowshik |
| 5,682,389 A | 10/1997 | Nizaka |
| 5,729,162 A | 3/1998 | Rouy |
| 5,761,115 A | 6/1998 | Kozicki et al. |
| 5,770,885 A | 6/1998 | McCollum et al. |
| 5,801,415 A | 9/1998 | Lee et al. |
| 5,812,452 A | 9/1998 | Hoang |
| 5,896,312 A | 4/1999 | Kozicki et al. |
| 5,914,893 A | 6/1999 | Kozicki et al. |
| 5,986,322 A | 11/1999 | McCollum et al. |
| 6,063,663 A | 5/2000 | Caprara et al. |
| 6,084,796 A | 7/2000 | Kozicki et al. |
| 6,100,560 A | 8/2000 | Lovett |
| 6,137,725 A | 10/2000 | Tassan et al. |
| 6,144,580 A | 11/2000 | Murray |
| 6,222,774 B1 | 4/2001 | Tanzawa et al. |
| 6,324,102 B1 | 11/2001 | McCollum |
| 6,326,651 B1 | 12/2001 | Manabe |
| 6,348,365 B1 | 2/2002 | Moore et al. |
| 6,356,478 B1 | 3/2002 | McCollum |
| 6,388,324 B2 | 5/2002 | Kozicki |
| 6,418,049 B1 | 7/2002 | Kozicki et al. |
| 6,437,365 B1 | 8/2002 | Hawley et al. |
| 6,469,364 B1 | 10/2002 | Kozicki |
| 6,487,106 B1 | 11/2002 | Kozicki |
| 6,635,914 B2 | 10/2003 | Kozicki et al. |
| 6,709,887 B2 | 3/2004 | Moore et al. |
| 6,768,687 B2 | 7/2004 | Kaihatsu |
| 6,784,476 B2 | 8/2004 | Kim et al. |
| 6,798,692 B2 | 9/2004 | Kozicki et al. |
| 6,815,784 B2 | 11/2004 | Park et al. |
| 6,825,489 B2 | 11/2004 | Kozicki |
| 6,847,073 B2 | 1/2005 | Kanaya |
| 6,849,891 B1 | 2/2005 | Hsu et al. |
| 6,864,500 B2 | 3/2005 | Gilton |
| 6,865,117 B2 | 3/2005 | Kozicki |
| 6,891,769 B2 | 5/2005 | McCollum et al. |
| 6,914,802 B2 | 7/2005 | Kozicki |
| 6,927,411 B2 | 8/2005 | Kozicki |
| 6,940,745 B2 | 9/2005 | Kozicki |
| 6,955,940 B2 | 10/2005 | Campbell et al. |
| 6,970,383 B1 | 11/2005 | Han et al. |
| 6,985,378 B2 | 1/2006 | Kozicki |
| 6,998,312 B2 | 2/2006 | Kozicki et al. |
| 7,006,376 B2 | 2/2006 | Kozicki |
| 7,061,036 B2 | 6/2006 | Kajiyama |
| 7,078,295 B2 | 7/2006 | Jeon et al. |
| 7,101,728 B2 | 9/2006 | Kozicki et al. |
| 7,120,053 B2 | 10/2006 | Atsumi et al. |
| 7,120,079 B2 | 10/2006 | McCollum et al. |
| 7,126,837 B1 | 10/2006 | Banachowicz et al. |
| 7,142,450 B2 | 11/2006 | Kozicki et al. |
| 7,145,794 B2 | 12/2006 | Kozicki |
| 7,169,635 B2 | 1/2007 | Kozicki |
| 7,180,104 B2 | 2/2007 | Kozicki |
| 7,187,610 B1 | 3/2007 | McCollum et al. |
| 7,227,169 B2 | 6/2007 | Kozicki |
| 7,232,717 B1 | 6/2007 | Choi et al. |
| 7,245,535 B2 | 7/2007 | McCollum et al. |
| 7,288,781 B2 | 10/2007 | Kozicki |
| 7,294,875 B2 | 11/2007 | Kozicki |
| 7,301,821 B1 | 11/2007 | Greene et al. |
| 7,339,232 B2 | 3/2008 | Seo et al. |
| 7,368,789 B1 | 5/2008 | Dhaoui et al. |
| 7,372,065 B2 | 5/2008 | Kozicki et al. |
| 7,385,219 B2 | 6/2008 | Kozicki et al. |
| 7,402,847 B2 | 7/2008 | Kozicki et al. |
| 7,405,967 B2 | 7/2008 | Kozicki et al. |
| 7,430,137 B2 | 9/2008 | Greene et al. |
| 7,499,360 B2 | 3/2009 | McCollum et al. |
| 7,511,532 B2 | 3/2009 | Derharcobian et al. |
| 7,519,000 B2 | 4/2009 | Caveney et al. |
| 7,560,722 B2 | 7/2009 | Kozicki |
| 7,675,766 B2 | 3/2010 | Kozicki |
| 7,692,972 B1 | 4/2010 | Sadd et al. |
| 7,728,322 B2 | 6/2010 | Kozicki |
| 7,763,158 B2 | 7/2010 | Kozicki |
| 7,816,717 B2 | 10/2010 | Ozaki |
| 7,839,681 B2 | 11/2010 | Wang et al. |
| 7,928,492 B2 | 4/2011 | Jeon et al. |
| 7,929,345 B2 | 4/2011 | Issaq |
| 8,269,203 B2 | 9/2012 | Greene et al. |
| 8,269,204 B2 | 9/2012 | Greene et al. |
| 8,415,650 B2 | 4/2013 | Greene et al. |
| 8,531,866 B2 | 9/2013 | Ikegami et al. |
| 8,735,211 B2 | 5/2014 | Greeley et al. |
| 9,128,821 B2 | 9/2015 | Chen et al. |
| 9,704,573 B1 | 7/2017 | Hecht et al. |
| 2002/0003247 A1 | 1/2002 | Yokoyama et al. |
| 2003/0107105 A1 | 6/2003 | Kozicki |
| 2003/0222303 A1 | 12/2003 | Fukuda et al. |
| 2004/0124407 A1 | 7/2004 | Kozicki et al. |
| 2005/0141431 A1 | 6/2005 | Caveney et al. |
| 2005/0225413 A1 | 10/2005 | Kozicki et al. |
| 2006/0028895 A1 | 2/2006 | Taussig et al. |
| 2006/0050546 A1 | 3/2006 | Roehr et al. |
| 2006/0051927 A1 | 3/2006 | Takami et al. |
| 2006/0086989 A1 | 4/2006 | Lee et al. |
| 2006/0171200 A1 | 8/2006 | Rinerson et al. |
| 2006/0230375 A1 | 10/2006 | Casey et al. |
| 2006/0238185 A1 | 10/2006 | Kozicki |
| 2006/0291364 A1 | 12/2006 | Kozicki |
| 2007/0045728 A1 | 3/2007 | Lee |
| 2007/0075352 A1 | 4/2007 | Irie et al. |
| 2007/0108508 A1 | 5/2007 | Lin et al. |
| 2007/0109861 A1 | 5/2007 | Wang et al. |
| 2007/0121369 A1 | 5/2007 | Happ et al. |
| 2007/0146012 A1 | 6/2007 | Murphy et al. |
| 2007/0165446 A1 | 7/2007 | Oliva et al. |
| 2007/0165532 A1 | 7/2007 | Retana et al. |

(56) References Cited

U.S. PATENT DOCUMENTS

| | | |
|---|---|---|
| 2008/0101117 A1 | 5/2008 | Ogura et al. |
| 2008/0113560 A1 | 5/2008 | Caveney et al. |
| 2008/0211540 A1 | 9/2008 | Fujita |
| 2008/0279028 A1 | 11/2008 | McCollum et al. |
| 2009/0034325 A1 | 2/2009 | Lowrey et al. |
| 2009/0184359 A1 | 7/2009 | He et al. |
| 2009/0198812 A1 | 8/2009 | Caveney et al. |
| 2009/0283740 A1 | 11/2009 | Kozicki et al. |
| 2010/0092656 A1 | 4/2010 | Kozicki |
| 2010/0100857 A1 | 4/2010 | Chen et al. |
| 2010/0135071 A1 | 6/2010 | Kozicki |
| 2010/0149873 A1 | 6/2010 | Wang et al. |
| 2010/0157688 A1 | 6/2010 | Issaq |
| 2010/0169886 A1 | 7/2010 | Troxel et al. |
| 2010/0208520 A1 | 8/2010 | Wang et al. |
| 2011/0001108 A1 | 1/2011 | Greene et al. |
| 2011/0001115 A1 | 1/2011 | Greene et al. |
| 2011/0001116 A1 | 1/2011 | Greene et al. |
| 2011/0002167 A1 | 1/2011 | McCollum et al. |
| 2011/0024821 A1 | 2/2011 | Wang et al. |
| 2011/0205780 A1 | 8/2011 | Yasuda et al. |
| 2012/0223381 A1 | 9/2012 | Lu et al. |
| 2013/0134378 A1 | 5/2013 | Liu |
| 2013/0234100 A1 | 9/2013 | An et al. |
| 2014/0071745 A1 | 3/2014 | Kawasumi et al. |
| 2014/0151621 A1 | 6/2014 | Tendulkar et al. |
| 2014/0158968 A1 | 6/2014 | Jo et al. |
| 2014/0175531 A1 | 6/2014 | Huang et al. |
| 2014/0233301 A1 | 8/2014 | Lu et al. |
| 2014/0246719 A1 | 9/2014 | Dhaoui et al. |
| 2014/0264238 A1 | 9/2014 | Jo et al. |
| 2014/0269008 A1 | 9/2014 | Baker et al. |
| 2015/0076439 A1 | 3/2015 | Saitoh |

OTHER PUBLICATIONS

PCT/US2016/066967, Notification of Transmittal of The International Search Report and The Written Opinion of the International Searching Authority, or the Declaration, Form PCT/ISA/220.

PCT/US2017/054174, International Search Report and Written Opinion of the International Searching Authority dated Dec. 19, 2017.

PCT/US2017/062878 International Search Report and Written Opinion, dated Mar. 28, 2018.

Aratani, et al., "A Novel Resistance Memory with High Scalability and Nanosecond Switching," IEDM, 2007, pp. 783-786.

Baek, et al., "Highly Scalable Non-volatile Resistive Memory using Simple Binary Oxide Driven by Asymmetric Uni-polar Voltage Pulses, Samsung Advanced Institute of Technology," IDEM 2004, 26 pages.

Burr, G. W. et al., "Overview of Candidate Device Technologies for Storage-class Memory," IBM Journal of Research & Development, 2008, vol. 52, No. 4/5, pp. 449-464.

Wang, et al., U.S. Appl. No. 12/903,493, filed Oct. 13, 2013 entitled "Push-Pull FPGA Cell" (Abandoned).

Choi, S. J. et al., "Improvement of CBRAM Resistance Window by Scaling Down Electrode Size in Pure-GeTe Film," IEEE Electron Device Letters, Feb. 2009, vol. 30, No. 2, pp. 120-122.

Fang, T. N. et al, "Erase Mechanism for Copper Oxide Resistive Switching Memory Cells with Nickel Electrode," Int'l Electron Devices Meeting, 2006, pp. 1-4.

Greene, Jonathan et al., "Antifuse Field Programmable Gate Arrays," Proceedings of the IEEE, Jul. 1993, vol. 81, No. 7, pp. 1042-1056.

Kund, Michael et al., "Conductive Bridging RAM (CBRAM): An Emerging Non-volatile Memory Technology Scalable to Sub 20nm," IEDM Technical Digest, Dec. 5, 2005, pp. 754-757, held in Washington, D.C.

Lemieux, G. et al., "Directional and Single-Driver Wires in FPGA Interconnect," International Conference on Field-Programmable Technology (ICFPT), Dec. 2004, pp. 41-48, Brisbane, Australia.

Meyer, R., "Scalable Non-volatile Cross-point Memory Based on Dual-layer Oxide Memory Elements," 9th Annual Non-volatile Memory Technology Symposium, Nov. 11-14, 2008, in Pacific Grove, CA, Unity Semiconductor Corporation, Sunnyvale, CA 94085, 41 pp.

Meyer, R. et al., "Oxide Dual-layer Memory Element for Scalable Non-volatile Cross-point Memory Technology," 9th Annual Non-volatile Memory Technology Symposium, Nov. 11-14, 2008, in Pacific Grove, CA, pp. 1-5.

Sakamoto, T. et al., "A /Ta2O5 Solid-Electrolyte Switch with Improved Reliabiltiy," 2007 IEEE Symposium on VLSI Technogy, Jun. 12-14, 2007, pp. 38-39, held in Kyoto, JP.

Strukov, Dimitri B. et al., "The Missing Memristor Found," Nature, May 1, 2008, vol. 453, pp. 80-85.

Symanczyk, Ralf, "Conductive Bridging Memory Devleopment from Single Cells to 2Mbit Memory Arrays," 8th Non-Volatile Memory Technology Symposium, Nov. 10-13, 2007, 25 pages.

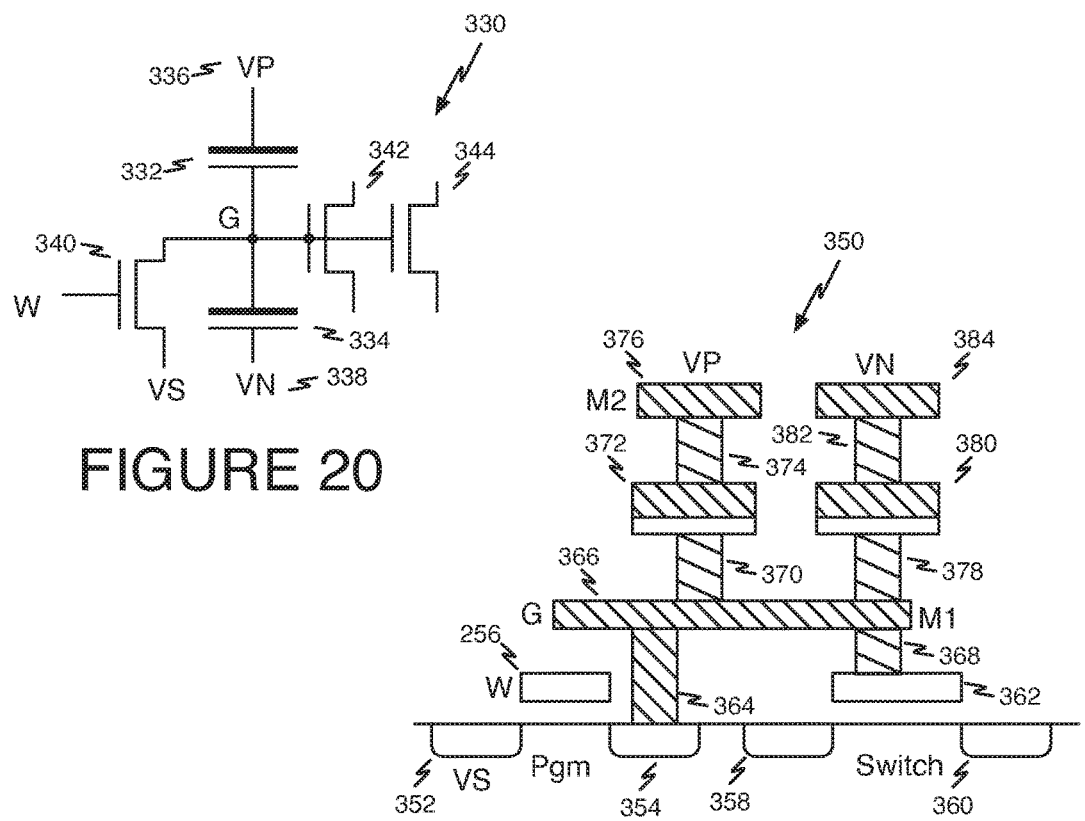
FIGURE 20
FIGURE 21
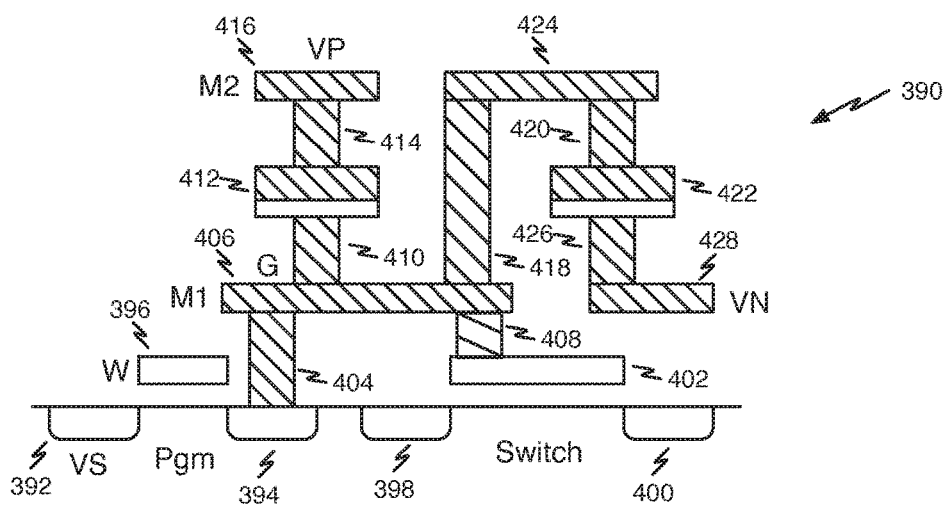
FIGURE 22

| logic | logic | logic | logic | logic | logic |
| --- | --- | --- | --- | --- | --- |
| NVM | NVM | NVM | NVM | NVM | NVM |
| logic | logic | logic | logic | logic | logic |
| logic | logic | logic | logic | logic | logic |
| RAM | RAM | RAM | RAM | RAM | RAM |
| logic | logic | logic | logic | logic | logic |

FRONT TO BACK RESISTIVE RANDOM ACCESS MEMORY CELLS

BACKGROUND

The majority of commercial programmable logic devices such as FPGAs use one-bit SRAM cells to store their configuration data. However SRAM cells consume significant static power, and lose their state when powered off. In addition, because SRAM cells need to be loaded at power-up, the configuration data is difficult to keep secure.

Using a non-volatile memory device to store the configuration data for programmable logic devices avoids these two problems. Many types of non-volatile memory devices are known. See for example Burr, et al., IBM J. Res. & Dev. Vol. 52 No. 4/5, 2008, "A Novel Resistance Memory with High Scalability and Nanosecond Switching", IEDM 2007. Various non-volatile memory devices are known, and some of them are more suitable than others for use as configuration memory for programmable logic devices.

Antifuses are two-terminal, one-time-programmable memory devices. A sufficiently high current in either direction will irreversibly change the device from a high resistance state to a low resistance state. In the initial high resistance state, antifuses can tolerate normal logic voltages across them in either direction without risk of being programmed and without undue leakage currents. In the low-resistance state, antifuses can tolerate logic signal currents flowing through them in either direction. Because of these properties, antifuses may be used directly in the signal paths of routing networks as a programmable switch. Antifuse have been employed in FPGA integrated circuits, such as the Act1, Act2, MX, SX, and AX families manufactured and marketed by Actel Corporation of Mountain View, Calif., and FPGA integrated circuits manufactured and marketed by QuickLogic of Sunnyvale, Calif.

In state-of-the-art, practical antifuse structures, the dielectric contains amorphous silicon and the state of the dielectric is altered by a phase change. There may also be a dielectric breakdown that occurs during programming. These are generally irreversible phenomena. Also, the critical dielectric is generally surrounded by inert barrier metal layers intended to keep contaminants out of the dielectric.

Floating gate transistors can be turned on and off by storing or removing charge from their floating gate. They are reprogrammable. Because flash devices have a high off resistance and a low on resistance, they can be used in the signal path as a programmable switch in programmable logic devices. One way to implement such a programmable switch is to employ a "switch-sense cell" as shown in FIGS. 1A through 1C. This cell is used in the ProASIC, APA, and PA3 families of FPGA integrated circuits manufactured and marketed by Actel Corporation. A small sense transistor device and a larger switch transistor device share a single floating gate. The sense device is used to program and read a configuration bit. Both transistors are connected to a control gate associated with a word line. The source and drain of the sense device are connected to bit lines for programming and erasing the cell. The switch device is inserted in a signal path of the programmable routing.

A general scheme for layout of an FPGA using a switch-sense cell is shown in FIG. 2. Many of the switches drive logic inputs. Flash devices must be separated from CMOS logic by a minimum separation. An area-efficient layout will thus intersperse horizontal bands of logic with horizontal bands of switches, with many rows of switches bunched together in one band. Grouping the rows of switches into fewer bands will reduce area wasted by switch-logic spacing but tends to lengthen the connecting wires.

Flash devices can also be used indirectly, controlling the gate of an NMOS pass device that serves as the switch. One way to do this is the push-pull arrangement, shown in FIG. 3. The switch is controlled by turning on one or the other of the flash devices. One flash device pushes the gate of the switch to ground, shutting the switch off. The other device pulls the gate of the switch to a voltage level sufficient to turn it on. The off resistance of the flash devices must be high so that static current is kept low. But the push-pull cell does not require as low an on resistance as does the switch-sense cell. U.S. Pat. No. 7,430,137 describes this and other related push-pull and cross-coupled cells whereby flash devices control NMOS pass gates or complementary NMOS/PMOS pass gates.

Although flash devices can be used either directly or indirectly to make programmable routing switches for FPGAs and other programmable logic devices, they do have a number of limitations. The need to separate flash devices from logic is noted above. In addition, about 12 extra masks are required to manufacture flash devices as compared to ordinary CMOS devices. They also require high voltages (~18V in current technology) to program and erase. They occupy space on the silicon substrate. Flash devices are radiation tolerant to some extent but are not completely immune to the effects of radiation. Integrating flash technology into a CMOS process may alter the performance of the ordinary CMOS transistors, and requires re-optimizing the integrated process.

SONOS devices are similar to flash devices. They require fewer masks to manufacture and have lower but still significant programming voltages (currently around 8V). SONOS devices are not suitable for use in the signal path of a programmable logic device due to their high on-state resistance and the fact that their state can be altered (or "disturbed") if the current passing through them gets too high. However SONOS devices can be used to form a push-pull cell, as described in, for example, U.S. Pat. No. 6,144,580.

U.S. Pat. No. 7,511,532 describes ways to use phase change memory (PCM) for configuration memory. PCM has several drawbacks. PCM devices can tolerate only small voltages (similar to or less than normal logic levels) across them when they are in an off state, and cannot tolerate these voltages for very long. The on-resistance of PCM devices is three orders of magnitude smaller than their off resistance. If read continuously in a simple push-pull cell, PCM devices will consume excessive static power.

Magnetic RAM (MRAM) devices are two-terminal memory devices that may be programmed or erased by applying a magnetic field generated by passing current through an adjacent addressing line. Examples of MRAM devices are those manufactured by EverSpin Technologies, Inc. of Chandler, Ariz. MRAM devices have a very low off-to-on resistance ratio of about 1.3.

Resistive RAM (RRAM) is a general name for two-terminal reprogrammable devices that can be set to either a low or high resistance state. These devices are based on reversible physical phenomena.

RRAM generally consists of a dielectric layer disposed between two electrodes. Some types of RRAM conduct by forming a distinct filament in a limited area of the dielectric. Other types of RRAM conduct by changing the properties of the dielectric throughout its area. Although many types of RRAM devices have been proposed over the years, as yet none of them has been proven to be reliable and manufacturable in practice.

Bipolar resistive RAM devices are two-terminal reprogrammable devices that exhibit hysteresis. They enter a low-resistance "on" state when voltage (and current) exceeding a certain threshold is applied in one direction and enter a high-resistance "off" state when voltage exceeding a certain threshold is applied in the opposite direction. FIG. 4 shows a generic representation of a bipolar RRAM device. The device would turn on when V2–V1 exceeds a positive threshold, such as 2 volts.

One important category of bipolar RRAMs are the "solid electrolyte" devices, also known as "conductive-bridging RAM" (CBRAM) and "programmable metallization cells" (PMC). In these devices the memory dielectric is a chalcogenide or glass material. Rather than isolating the dielectric between inert electrodes, one of the electrodes serves as a source of mobile ions that are intended to migrate into the dielectric material. The ions are typically Ag or Cu. The ions can form a conductive filament from one electrode to another through the intervening dielectric material. Such devices have been described in the literature. For example, see Qimonda, "Conductive Bridging Memory Development from Single Cells to 2 Mbit Memory Arrays", 8th Non-Volatile Memory Technology Symposium, Nov. 10-13, 2007; "A Novel Resistance Memory with High Scalability and Nanosecond Switching", IEDM 2007; "Improvement of CBRAM Resistance Window by Scaling Down Electrode Size in Pure-GeTe Film", IEEE Electron Device Letters, VOL. 30, No. 2, February 2009; M. Kund, et al "Conductive bridging RAM (CBRAM): an emerging non-volaitle memory technology scalable to sub 20 nm", IEDM p. 754, 2005; T. Sakamoto et al, "A Ta2O5 solid-electrolyte switch with improved reliability, Symp. VLSI Tech., p. 38, 2007; U.S. Pat. Nos. 6,348,365, 6,709,887, 6,864,500, and 6,955,940.

Other known types of bipolar RRAM devices include the "memristor" developed at Hewlett Packard Labs, described in Nature 453, 80-83 (1 May 2008); the "conductive metal oxide" (CMOx) memory cell developed at Unity Semiconductor, described in "Scalable Non-Volatile Cross-Point Memory based on Dual-Layer Oxide Memory Elements", Rene Meyer, 9th Annual Non-Volatile Memory Technology Symposium, Nov. 11-14, 2008, Pacific Grove, Calif.; ZnCdS reprogrammable "anti-fuses" for FPGAs, described in United States Published Patent Publication 2008/0211540.

Important parameters of these devices include off-state resistance and on-state resistance. To make a programmable logic device such as an FPGA with acceptable static power, the off resistance must be high (preferably greater than 100 Gohm in current technology). If the device is used directly as a switch, devices that remain off may have the ordinary logic voltage (currently 1.0 to 1.2V) across them and must be reliably able to withstand that voltage. If the device is used in a push-pull cell, the off device will also have a DC voltage of this magnitude or greater across it. For use directly as a switch, the on-state resistance needs to be less than a few Kohm. The requirements for a push-pull cell are not as stringent.

There are several other important parameters for such devices. They include the direction and magnitude of the program and erase voltages or currents, and the number of program/erase cycles that can be executed, called the endurance. The endurance should be at least 1000 cycles, preferably 100K cycles or more. The magnitude and direction of voltage and current the device can tolerate without risk of disturbing its state is also an important characteristic. For use directly as a switch, the device must be able to tolerate typical logic voltage and swing currents. The length of time the device will reliably hold its state, called the retention time is also important. Retention time should be at least 10 years, across a stated range of temperature or other operating conditions.

Other forms of resistive RAM are known which are unipolar, i.e. the program and erase voltages are applied in the same direction but are of different magnitude. Examples include devices described in: "Erase Mechanism for Copper Oxide Resistive Switching Memory Cells with Nickel Electrode", Int'l Electron Devices Meeting, 2006, pp. 1-4; "Highly Scalable Non-volatile Resistive Memory using Simple Binary Oxide Driven by Asymmetric Uni-polar Voltage Pulses", IEDM 2004.

The above-described prior-art RRAM structures suffer from yield issues when critical layers comprising the memory cell are disposed above a via. Some of these are due to the "seam" that often occurs in the top and center of the metal filling the via. FIG. 5 illustrates this problem in an RRAM device formed using a copper metal technology. Copper conductor 10 is surrounded by Cu barrier layer 12 and is formed in inter-metal dielectric layer 14. A SiN etch stop layer 16 is planar with the top surface of the copper metal layer 10. Layers 18 and 20 are formed above the surface of copper conductor 10 and SiN layer 16. Layers 18 and 20 are the memory cell dielectric and its electrode and can be formed in either order.

FIG. 5 shows a somewhat exaggerated view of how the seam 22, a gap that is sometimes left as metal fills the space of the via, causes bends in the layers 18 and 20 disposed above the metal. The bends make the layers deviate from an ideal flat shape. The site of the bend can become the thinnest point of the layer as indicated by arrows 24 and 26 in layers 18 and 20. Since the electric field across a layer is strongest at its thinnest point, the electrical properties of the memory cell become less predictable as a result of the thinned-out layers caused by the unpredictable filling of the seam 22. An example of a prior art structure subject to this problem is shown in FIG. 3 of "A Novel Resistance Memory with High Scalability and Nanosecond Switching", IEDM 2007, in which the seam is clearly visible.

Prior Art FPGA architectures include SRAM FPGA Architectures. The SRAM cell consists of two inverters in a ring and two addressing devices. One output of the SRAM cell, or both complementary outputs, may be used to drive the gates of pass devices serving as programmable routing switches. In some cases, the output of the SRAM cell may be buffered before driving the pass device gates. The supply voltage of the SRAMs may be above that used in the logic so that the NMOS pass device can pass a full rail signal and the level restoration pull-up device can be omitted.

Recent SRAM-based FPGA architectures have organized the programmable routing so that each routing track is driven by a single buffer and the buffer is driven by a multiplexer that selects one of the possible alternative input signals. See Lemieux, Int'l Conf. Field Programmable Tech., 2004, FIGS. 4 (right hand side) and 7.

A routing architecture suitable for use with antifuses is described in U.S. Pat. Nos. 4,758,745 and 4,873,459 and others assigned to Actel Corporation. U.S. Pat. No. 5,537,056 shows two antifuses with a common terminal connected to an addressing device in FIG. 3.

Certain manufacturers of SRAM FPGAs have tried to obtain some of the benefits of non-volatile configuration memory by providing a bulk non-volatile memory alongside a conventional SRAM FGPA. For instance, the Xilinx Spartan 3N FPGA includes a non-volatile memory chip in the same package as an SRAM FPGA chip. The XP2 FPGAs from Lattice Semiconductor provide non-volatile flash memory blocks adjacent to an SRAM FPGA on the same chip. In some cases the bulk NVM may be made available for read or read/write operations by the user's logic as well.

Flash FPGA Architecture is typified by the architecture of the flash-based FPGAs from Actel Corporation. In addition to using flash to configure the logic and routing of the FPGA fabric, certain flash FPGAs, such as Actel's Fusion products, also provide a large block of bulk NVM storage that may be accessed by the user's logic.

Unfortunately, flash technology requires a large amount of overhead circuitry, such as complex row and column drivers, programming control logic, and charge pumps to generate the high voltages required for programming and erase operations. For this reason, the NVM blocks are large in size and limited in number (typically only one). This limits the ways the NVM storage can be applied in user designs, e.g. by limiting the bandwidth or number of ports of the NVM storage.

U.S. Pat. No. 7,402,847 discloses examples of solid electrolyte RRAM devices and ways they can be used to make a crossbar interconnect suitable for FPGA routing. In particular, this reference discloses a back-to-back arrangement of two RRAM devices to form a programmable switch, as shown in FIGS. 7-10. The back-to-back arrangement helps reduce the chance of disturbing the state of off switches during normal operation since the voltage threshold necessary to program the switch to a conducting state is roughly doubled.

However the approach described has several drawbacks. First, an additional tristate driver (1106 or 1108) is needed for every routing track (204 or 206) carrying signals that are connected by the programmable switch (1102). This takes extra area. In typical FPGA architectures many if not most tracks are driven by the outputs of logic cells or routing buffers. If the tristate driver used for programming a track is turned on it might fight with the logic or routing buffer output that normally drives the same track. Of course, some means could be provided to override or disconnect the normal output, but this generally costs area and delay.

Further, no scheme for addressing the routing track drivers or common terminals of the programmable switches (see FIGS. 7 and 9) is disclosed. In addition, the routing architecture is a partial crossbar matrix with programmable switches at the locations where vertical and horizontal tracks cross. There is no provision for tracks that are not linear in either a horizontal or vertical direction. This limits the performance and routability of the architecture.

In a crossbar architecture, at least some of the programmable switches must drive fairly substantial capacitances. For example, at 65 nm technology, routing tracks may be on the order of 100 to 1000 um long, and may have a capacitance of 0.2 fF per um. The on-resistance of a programmable switch can be on the order of $10^2$ to $10^6$ ohms. The RC time constant is thus 2 nsec to 0.2 msec. This is comparable to or much larger than a typical clock period at which it is desired to operate the circuit, say 2 nsec. As a result significant voltages may occur across a programmed switch, which may cause its resistance to increase (read disturb of on-switches).

As shown in FIG. 8 of U.S. Pat. No. 7,402,847, the common anode is on the upper layer of metal. This is inefficient for layout, since the common terminal of the two devices comprising the switch will need to be connected to an addressing transistor through a contact on the lowest layer of metal.

U.S. Pat. No. 7,511,532 describes a push-pull cell using solid-electrolyte RRAM devices in a back-to-back arrangement (see FIG. 23A). Because of the back-to-back arrangement and the particular polarity chosen, pullup devices that are turned off are subject to DC stress during operation that would tend to turn them on.

United States Patent Publication 2007/0165446 discloses a way to use phase change or solid electrolyte RRAM cells to make SEU hardened SRAM cells.

BRIEF DESCRIPTION OF THE DRAWING FIGURES

FIG. 20 is a diagram that illustrates a front-to-back push-pull cell according to the present invention.

FIG. 21 is a cross sectional view of one alternative push-pull cell layout according to the present invention.

FIG. 22 is a cross sectional view of another alternative push-pull cell layout according to the present invention.

DETAILED DESCRIPTION

Persons of ordinary skill in the art will realize that the following description of the present invention is illustrative only and not in any way limiting. Other embodiments of the invention will readily suggest themselves to such skilled persons.

According to an aspect of the present invention, area-efficient solid electrolyte RRAM device structures are disclosed. The RRAM devices according to the present invention are more manufacturable and are more reliable than prior-art RRAM devices.

Figure 5:
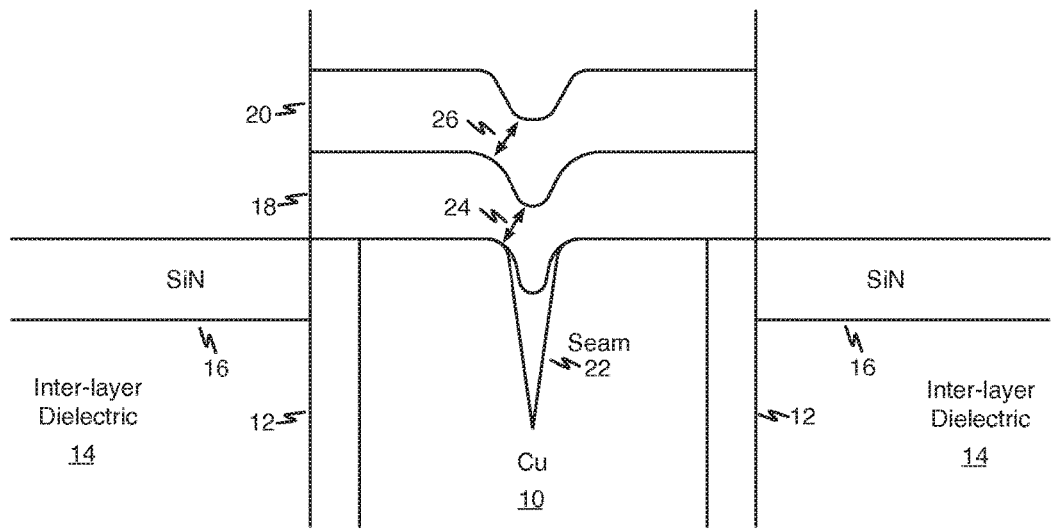
FIG. 5 is a diagram illustrating how a gap that is sometimes left as metal fills the space of a via, causes bends in the layers disposed above the metal and deleteriously affecting prior-art RRAM devices.
Figure 6:
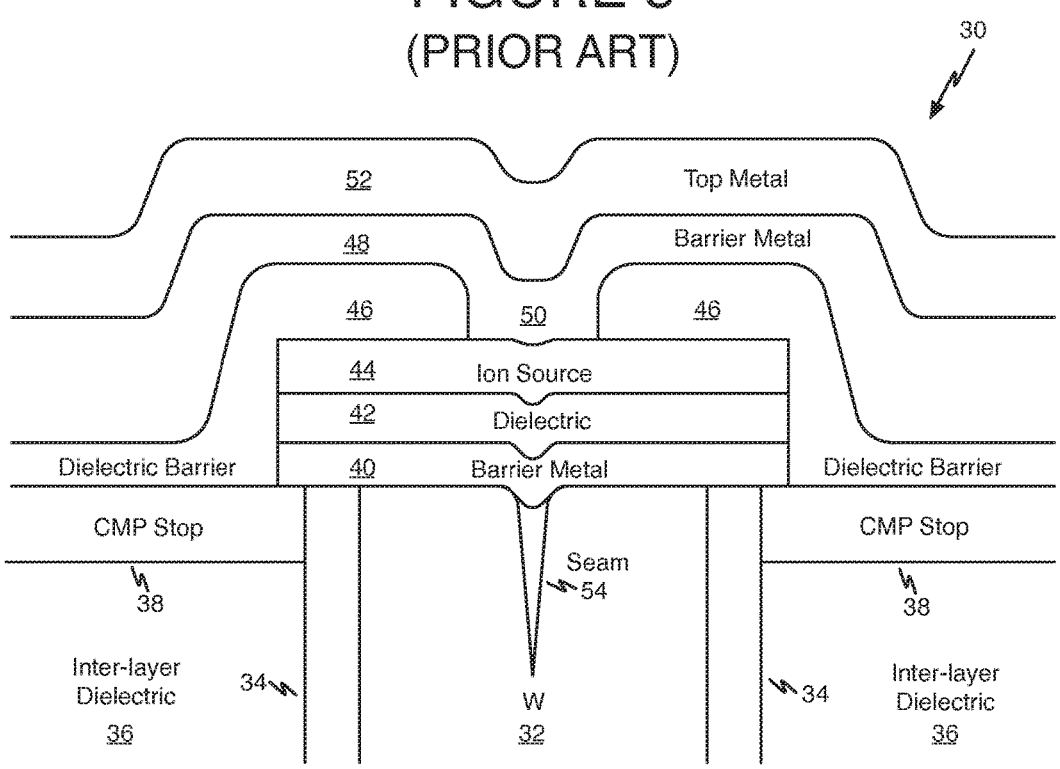
FIG. 6 is a cross-sectional diagram illustrating a resistive RAM device according to one aspect of the present invention.

Referring now to FIG. 6, a cross-sectional diagram shows the structure of an illustrative RRAM device 30 according to the present invention presenting one way to reduce the seam problem illustrated in FIG. 5. The RRAM device 30 illustrated in FIG. 6 can be incorporated into a process using tungsten-filled vias.

RRAM device 30 is formed over a tungsten via 32. Tungsten via 32 is surrounded by a barrier layer 34 and is formed in inter-metal dielectric layer 36. A CMP stop layer 38 is formed over the top of the inter-metal dielectric layer 36 and is used in the process employed to planarize the top of tungsten plug 32 as is known in the art. SiN or SiC are commonly employed as CMP stop layers.

Persons of ordinary skill in the art will appreciate that the CMP stop layers described with reference to FIG. 6, as well as all of the other embodiments disclosed herein may not be required and are optional. Their use or non-use will depend on the CMP technology used by the manufacturer. Some CMP processes may be able to have a timed polish step and do not need the CMP stop layer. This is preferred because it makes the process of depositing the dielectric layers simpler. In addition, the removal of SiN which has a dielectric constant of 7 and replaced with silicon oxide which has a dielectric constant of 4 is preferred and will reduce the coupling capacitance of the metal layers, thus improving the speed performance of the product.

According to the aspect of the present invention illustrated in FIG. 6, one or two layers 40 of a barrier metal are formed above the via 32. The barrier metal layer(s) 40 may be formed from a material such as Ta, TaN, Ti or TiN, W or other suitable material.

A dielectric layer 42 is formed above barrier metal layer 40. The dielectric layer 42 may be formed from GeS or other chalcogenides, glasses, etc., known to serve a similar function in a solid electrolyte RRAM device. A top electrode or ion source 44 is formed over the dielectric layer 42 and is formed from a material such as Ag, since Cu may be difficult to plasma etch.

The stack of layers 40, 42, and 44 is etched to form an aligned stack. A dielectric barrier layer 46 formed from a material such as SiN or SiC is formed over the defined stack. A via 50 is formed in the dielectric barrier layer 46 to expose the upper surface of ion source layer 44. A barrier metal layer 48 is then formed over the dielectric barrier layer and makes contact with ion source layer 44 in via 50. The top metal 52 may be formed from a material such as Al, Cu or other metal used for interconnect layers in integrated circuits.

Figure 7:
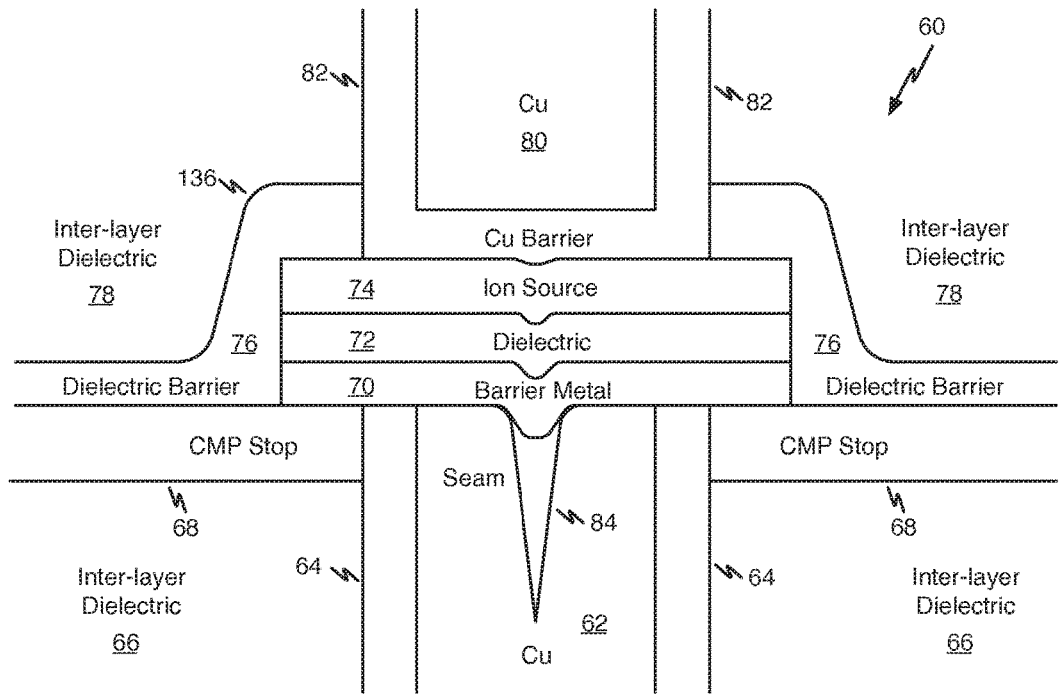
FIG. 7 is a cross-sectional diagram illustrating a resistive RAM device according to another aspect of the present invention.

Referring now to FIG. 7, a cross-sectional diagram shows the structure of another illustrative RRAM device 60 according to the present invention presenting a way to reduce the seam problem illustrated in FIG. 5. FIG. 7 shows an illustrative embodiment of a structure for a copper metallization process.

RRAM device 60 is formed over a copper via 62. Copper via 62 is surrounded by a Cu barrier layer 64 and is formed in inter-metal dielectric layer 66. A CMP stop layer 68 is formed over the top of the inter-metal dielectric layer 36 and is used in the process employed to planarize the top of copper plug 62 as is known in the art. SiN or SiC are commonly employed as CMP stop layers. According to this aspect of the present invention, one or two layers 70 of a barrier metal are formed above the via 62 and extend beyond the edges of the via and over the CMP stop layer 68. The barrier metal layer(s) 70 may be formed from a material such as Ta, TaN, Ti or TiN, W or other suitable material.

A dielectric layer 72 is formed above barrier metal layer 70. The dielectric layer 72 may be formed from GeS or other chalcogenides, glasses, etc., known to serve a similar function in a solid electrolyte RRAM device. A top electrode or ion source 74 is formed over the dielectric layer 72 and is formed from a material such as Ag, since Cu may be difficult to plasma etch.

The stack of layers 70, 72, and 74 is etched to form an aligned stack. A dielectric barrier layer 76 formed from a material such as SiN or SiC is formed over the defined stack. Another inter-layer dielectric layer 78 is then formed over dielectric barrier layer 76. A via is formed in the inter-layer dielectric layer 78 and dielectric barrier layer 76 to expose the upper surface of ion source layer 74. A top copper metallization layer including copper 80 surrounded by Cu barrier layer 82 is then formed in the inter-layer dielectric layer 78 and makes contact with ion source layer 74 in the via. Persons of ordinary skill in the art will appreciate that an additional barrier metal layer (not shown) may optionally be added above the ion source layer 74 to protect the ion source material from being etched during subsequent processing.

Figure 8:
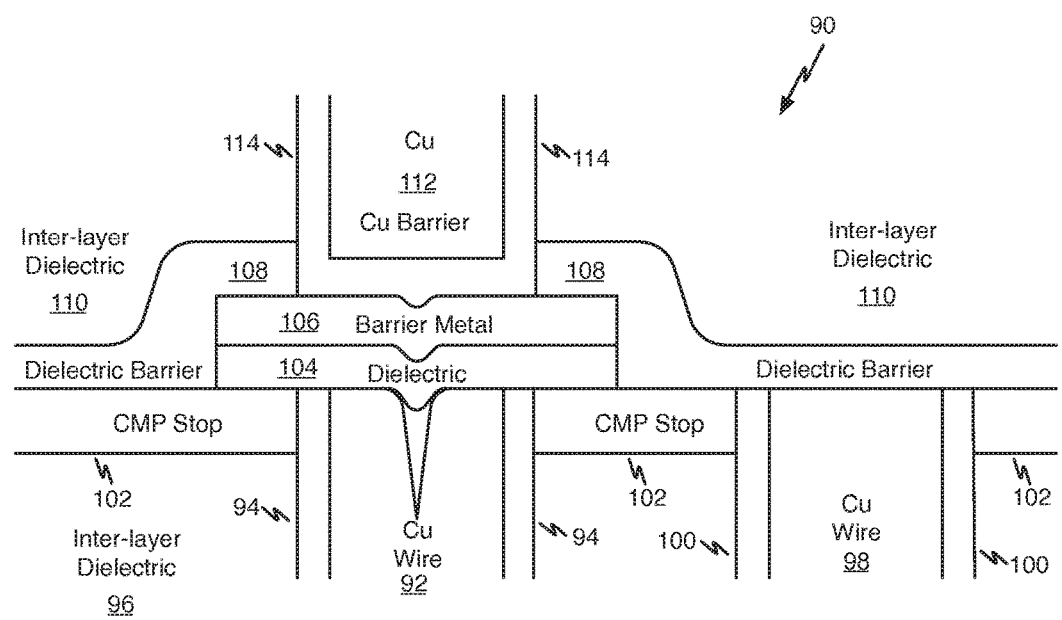
FIG. 8 is a cross-sectional diagram illustrating a resistive RAM device according to another aspect of the present invention.

In a copper metallization process it becomes possible to use the copper wires or vias as the ion source in a solid electrolyte RRAM device. Referring now to FIG. 8, a cross-sectional view shows an idealized rendering of a preferred embodiment of such a structure.

RRAM device 90 of FIG. 8 is formed over a copper wire 92. Copper wire 92 is surrounded by a Cu barrier layer 94 and is formed in inter-metal dielectric layer 96. Another copper wire 98 is shown having been formed in inter-metal dielectric layer 96 and is surrounded by a Cu barrier layer 100. The Cu barrier material may be Ta, TaN, Ti or TiN. The copper wire 92 serves as the ion source. A CMP stop layer 102 is formed over the top of the inter-metal dielectric layer 96 and is used in the process employed to planarize the top of copper wires 92 and 98 as is known in the art. SiN or SiC are commonly employed as CMP stop layers. According to this aspect of the present invention, a dielectric layer 104 is formed above the copper wire 92 and extend past its edges over CMP stop layer 102. The dielectric layer 104 may be formed from GeS or other chalcogenides, glasses, etc., known to serve a similar function in a solid electrolyte RRAM device.

At least one barrier metal layer 106 is formed above dielectric layer 104. The barrier metal layer(s) 106 may be formed from a material such as Ta, TaN, Ti or TiN, W or other suitable material.

The stack of layers 104, and 106 is etched to form an aligned stack. A dielectric barrier layer 108 formed from a material such as SiN or SiC is formed over the defined stack. Another inter-layer dielectric layer 110 is formed over the dielectric barrier layer 108. A via is formed in the inter-layer dielectric layer 110 and the dielectric barrier layer 108 to expose the upper surface of barrier metal layer 106. A top copper metallization layer including copper 112 surrounded by Cu barrier layer 114 is then formed in the via and makes contact with barrier metal layer 106 at the bottom of the via.

Figure 9:
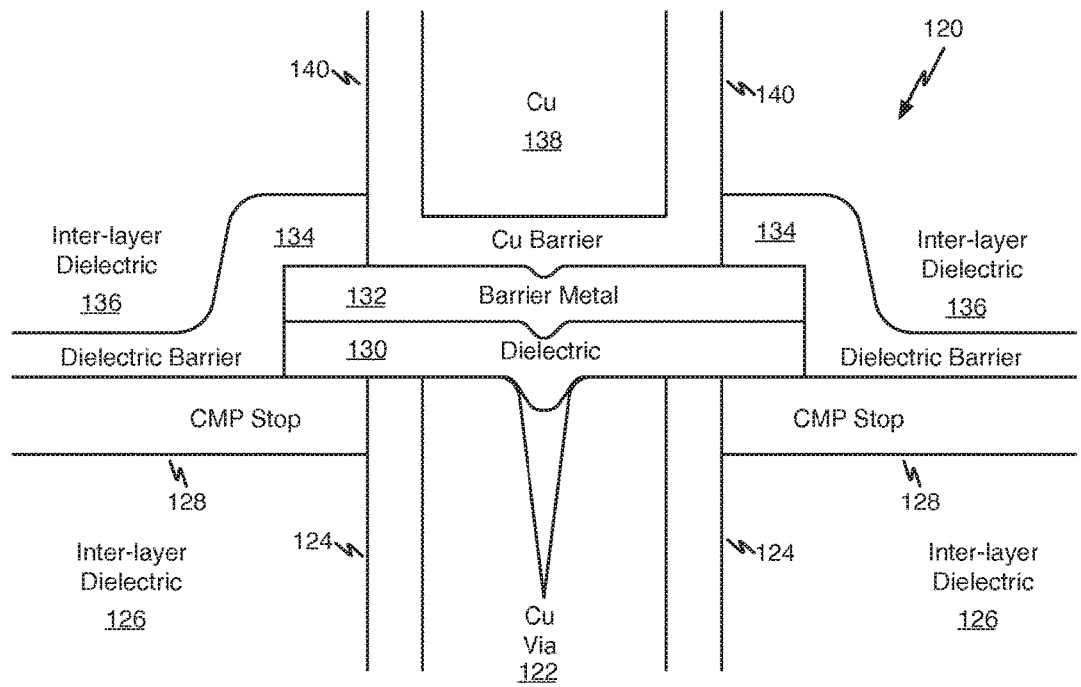
FIG. 9 is a cross-sectional diagram illustrating a resistive RAM device according to another aspect of the present invention.

Referring now to FIG. 9, a cross sectional view shows another embodiment of an RRAM cell 120 having a copper-filled via instead of a wire below the memory cell. The memory cell 120 is similar to memory cell 90 of FIG. 8 except for the narrower width of the copper via as compared to the width of the copper wire 92 of FIG. 8.

RRAM device 120 of FIG. 9 is formed over a copper via 122. Copper via 122 is surrounded by a Cu barrier layer 124 and is formed in inter-metal dielectric layer 126. The Cu barrier material may be Ta, TaN, Ti or TiN. The copper via 122 serves as the ion source. An optional CMP stop layer 128 is formed over the top of the inter-metal dielectric layer 126 and is used in the process employed to planarize the top of copper via 122 as is known in the art. SiN or SiC are commonly employed as CMP stop layers. According to this aspect of the present invention, a dielectric layer 130 is formed above the copper via 122 and extend past its edges over CMP stop layer 128. The dielectric layer 130 may be formed formed from GeS or other chalcogenides, glasses, etc., known to serve a similar function in a solid electrolyte RRAM device.

A barrier metal layer 132 is formed above dielectric layer 130. The barrier metal layer 132 may be formed from a material such as Ta, TaN, Ti or TiN, W or other suitable material.

The stack of layers 130 and 132 is etched to form an aligned stack. A dielectric barrier layer 134 formed from a material such as SiN or SiC is formed over the defined stack. Another inter-layer dielectric layer 136 is formed over the dielectric barrier layer 134. A via is formed in the inter-layer dielectric layer 136 and the dielectric barrier layer 134 to expose the upper surface of the barrier metal layer 132. A top copper metallization layer including copper 138 surrounded by Cu barrier layer 140 is then formed in the via and makes contact with the top of barrier metal layer 132 at the bottom of the via.

The present invention has several advantageous features. First, several embodiments of the invention use copper wires or vias that are already present for interconnect metallization as the ion source in a solid electrolyte cell. The ion source is at the bottom of the device rather than the top as in some of the prior-art implementations. This may be advantageous for layout of certain switch cells, where it may be desirable for the common electrode to be at the bottom of the structure. By themselves, the structures disclosed in FIGS. 8 and 9 do not specifically address the seam problem. There are other embodiments of the present invention that address the seam problem with these types of structures.

Figure 10:
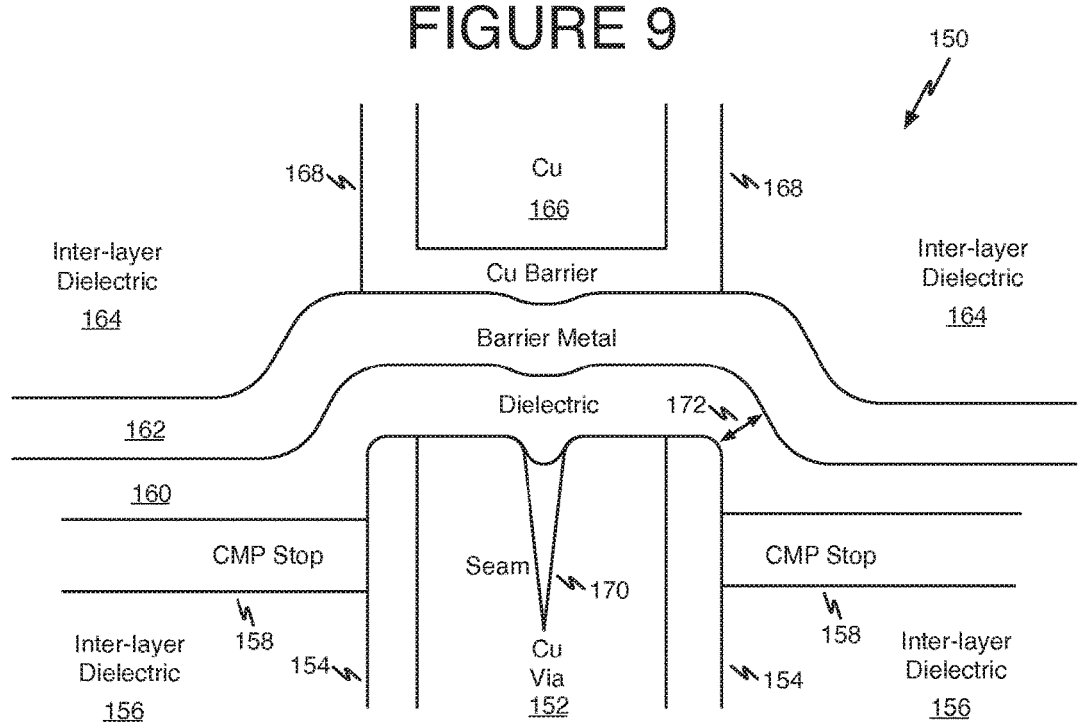
FIG. 10 is a cross-sectional diagram illustrating a resistive RAM device according to another aspect of the present invention.

Referring now to FIG. 10, a RRAM device 150 with a raised plug is disclosed. FIG. 10 shows a raised plug structure for RRAM and shows the impact of the seam on the layers above for the structure using the underlying Cu Via material as the ion source.

RRAM device 150 of FIG. 10 is formed over a raised copper via 152. Copper via 152 is surrounded by a Cu barrier layer 154, is formed in inter-metal dielectric layer 156, and extends beyond the top surface of CMP stop layer 158. The Cu barrier layer 154 may be Ta, TaN, Ti or TiN. The corners of barrier layer 154 are rounded (e.g., by CMP) to allow for increased thickness of the dielectric at point 172. The raised copper via 152 serves as the ion source. A CMP stop layer 158 is formed over the top of the inter-metal dielectric layer 156 and is used in the process employed to raise the top of copper via 152 as is known in the art. SiN or SiC are commonly employed as CMP stop layers.

According to this aspect of the present invention, a dielectric layer 160 is formed above the raised copper via 152 and extends past its edges over CMP stop layer 158. The dielectric layer 160 may be formed from GeS or other chalcogenides, glasses, etc., known to serve a similar function in a solid electrolyte RRAM device.

A barrier metal layer 162 is formed above dielectric layer 160. The barrier metal layer 162 may be formed from a material such as Ta, TaN, Ti or TiN, W or other suitable material.

Another inter-layer dielectric layer 164 is formed over the dielectric barrier metal layer 162. A via is formed in the inter-layer dielectric layer 164 to expose the upper surface of the raised copper via 152. A top copper metallization layer including copper 166 surrounded by Cu barrier layer 168 is then formed in the via and makes contact with the top of barrier metal layer 162 at the bottom of the via.

In contrast to prior art structures such as the one shown in FIG. 5, the thinnest point of the layers over the copper via plug in the embodiment of FIG. 10, especially the dielectric layer 160 is no longer at the seam 170. Instead, the thinnest point is now at the circumference of the plug as shown at arrows 172, where it can be more easily controlled during manufacturing. This technique is especially effective for those types of RRAM in which a filament is formed in the on state.

The structure shown in FIG. 10 results from adding one CMP step to the standard copper metallization process. This additional step is a CMP dielectric polishing step which reduces the thickness of the CMP stop layer 158, leaving the copper via raised relative to the top of the CMP stop layer 158, and rounding the top corners of the copper via 152. While SiN is the preferred material for CMP stop layer 158, SiC or the inter-layer dielectric material may also be used.

Figure 11:
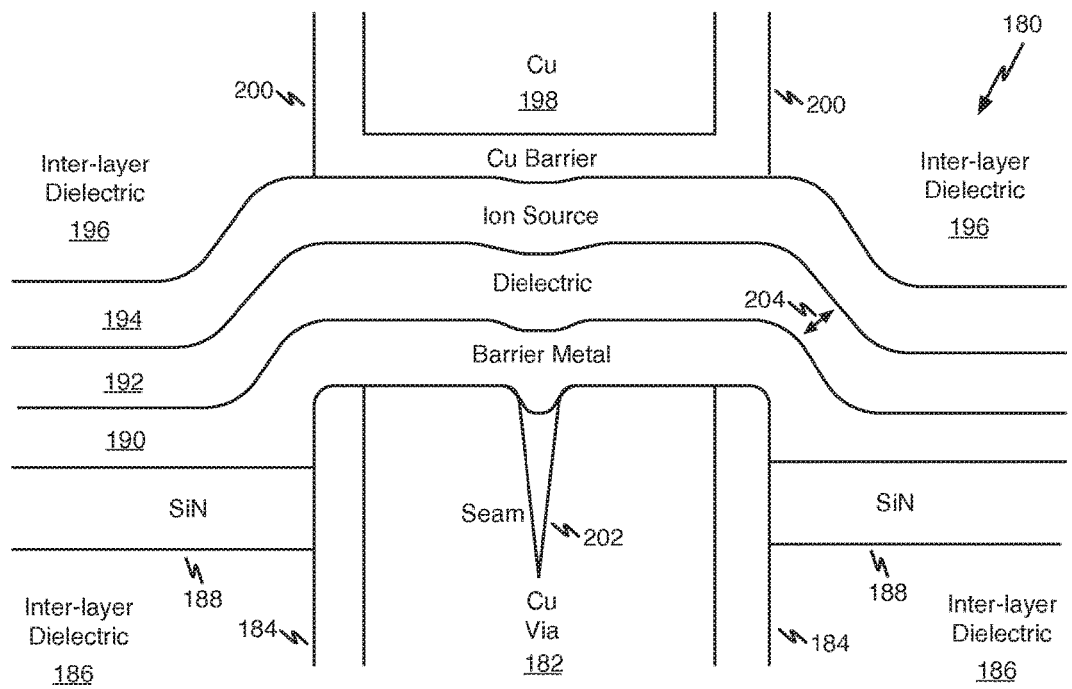
FIG. 11 is a cross-sectional diagram illustrating a resistive RAM device according to another aspect of the present invention.

The raised plug may be used in combination with the other structures described previously. For instance, even if there is a barrier metal layer between the raised plug and the dielectric, the raised plug will still shift the thinnest point of the dielectric to the circumference of the plug, as shown in FIG. 11.

According to another aspect of the present invention, a raised copper via plug structure for an RRAM Device is shown where the via is not used as the ion source. Referring now to FIG. 11, a full stack structure RRAM device 180 is formed over a raised copper via 182. Copper via 182 is surrounded by a Cu barrier layer 184, is formed in inter-metal dielectric layer 186, and extends beyond the top surface of CMP stop layer 188. The Cu barrier layer 184 may be Ta, TaN, Ti or TiN. The raised copper via 182 does not serve as the ion source in this embodiment. The CMP stop layer 188 is formed over the top of the inter-metal dielectric layer 186 and is used in the process employed to raise the top of copper via 182 above its upper surface as is known in the art. SiN or SiC are commonly employed as CMP stop layers.

According to this aspect of the present invention, a barrier metal layer 190 is formed above the raised copper via 152 and extend past its edges over CMP stop layer 158. The barrier metal layer 160 may be formed from a material such as Ta, TaN, Ti or TiN, W or other suitable material.

A dielectric layer 192 is formed above barrier metal layer 190. The dielectric layer 192 may be formed from GeS or other chalcogenides, glasses, etc., known to serve a similar function in a solid electrolyte RRAM device. An ion source layer 194 is formed over the dielectric layer 192 and is formed from a material such as Ag.

Another inter-layer dielectric layer 196 is formed over the ion source layer 194. A via is formed in the inter-layer dielectric layer 196 to expose the upper surface of the ion source layer 194. A top copper metallization layer including copper 198 surrounded by Cu barrier layer 200 is then formed in the via and makes contact with the top of barrier metal layer 196 at the bottom of the via. It is to be understood that layers 190-194 may be extended as shown in FIG. 11, in one or more directions, or may be "cut" as shown in FIG. 9 on one or more sides.

As in the embodiment of FIG. 10, and in contrast to prior art structures such as the one shown in FIG. 5, the thinnest point of the layers over the copper via plug in the embodiment of FIG. 11 is no longer at the seam 202. Instead, the thinnest point is now at the circumference of the plug as shown at arrows 204, where it can be more easily controlled during manufacturing. This technique is also especially effective for those types of RRAM in which a filament is formed in the on state.

Figure 12:
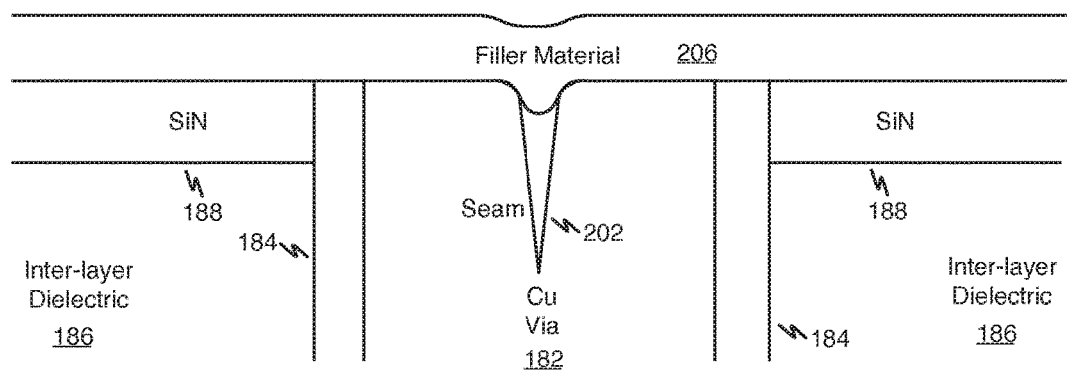
FIG. 12 is a cross-sectional diagram illustrating a resistive RAM device according to another aspect of the present invention.

Referring now to FIG. 12, according to another aspect of the present invention, the issue of the seam in the copper via (or even a metal interconnect line) can be further improved. FIG. 12 shows a portion of the embodiment illustrated in FIG. 11. This filler technique could be applied to all the FIG. 6-11 structures. FH Structures from the embodiment of FIG. 11 that are also shown in FIG. 12 are designated by the same reference numerals used in FIG. 11 to designate those structures.

As shown in FIG. 12, the issue of the seam in the copper via (or even a metal interconnect line) can be further improved further by adding a fill material 206 in the seam 202. Note that FIG. 12 shows the situation after the fill material is applied, but before the excess is removed in the final CMP step. The fill material 206 can be either a conductive or non-conductive material as long as it seals the seam from contamination escaping and the fill material 206 itself does not contaminate the RRAM dielectric. Non-conductive fill material can be used since after most of it is removed in the final CMP step the filler will no longer cover the outer portion of the via. Suitable fill materials may include SiO2 or SiN, barrier metals such as Ti, Ta, W, TiN, TaN, or other materials, even Cu. The preferred deposition method is CVD due to its superior step coverage, although PVD could be used as well. The deposition should occur just before the final CMP step used to raise the via plug 182 as described with reference to the embodiments of FIGS. 10 and 11. The final CMP step would then remove the sealant fill material from the top and corners of the metal line or via fill material while leaving it remaining in the seam to smooth out the metal line or via and thereby improve the control and yield of the RRAM cell.

Figure 1A:
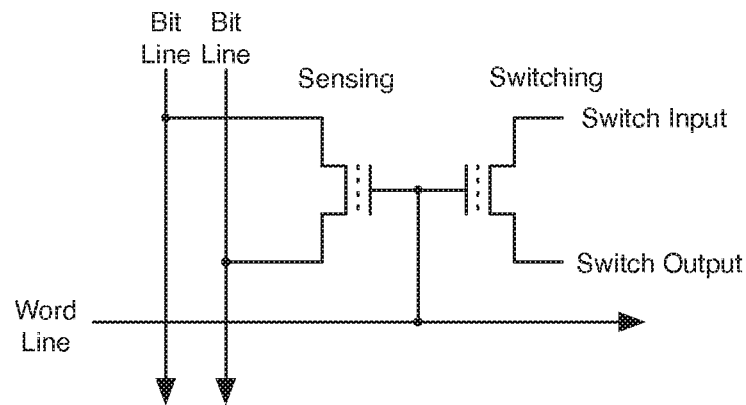
FIG. 1A is a circuit diagram showing a prior art switch-sense cell employed to implement a programmable switch.
Figure 1B:
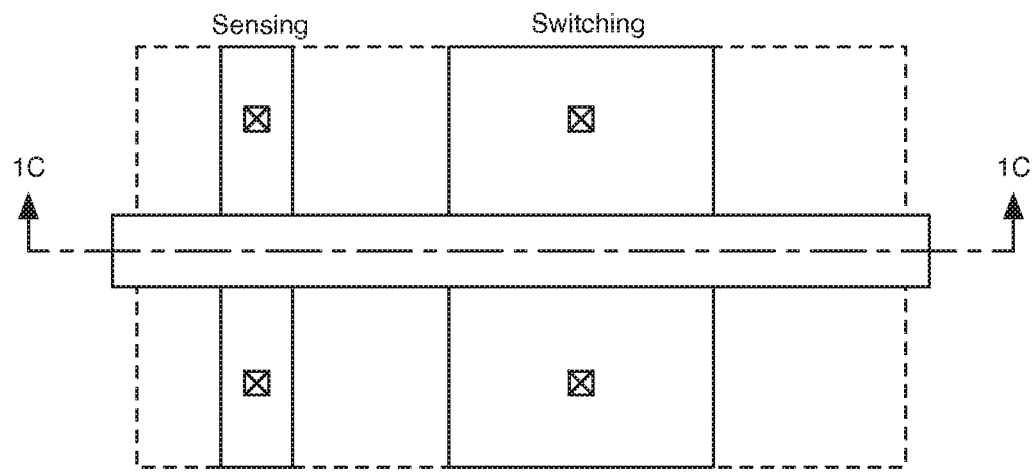
FIGS. 1B and 1C are, respectively, top and cross-sectional views of the prior art switch-sense cell of FIG. 1A.
Figure 1C:
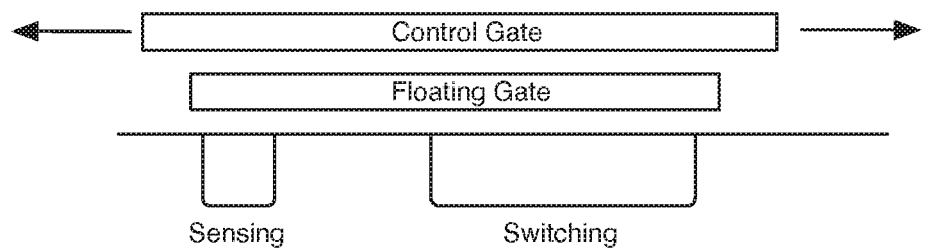
Figure 2:
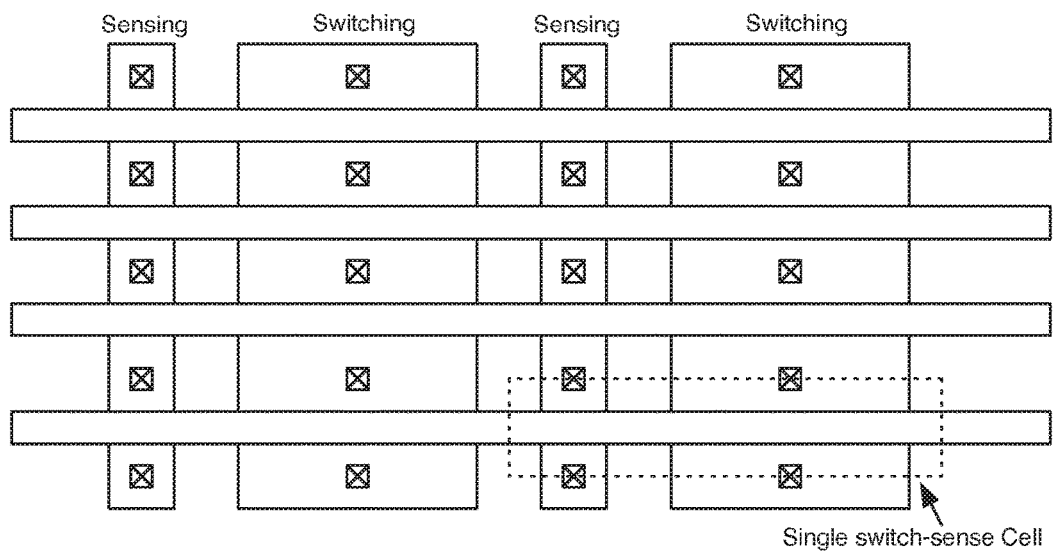
FIG. 2 is a layout diagram showing a general scheme for layout of a prior art programmable logic device using a switch-sense cell such as the one of FIG. 1.
Figure 3:
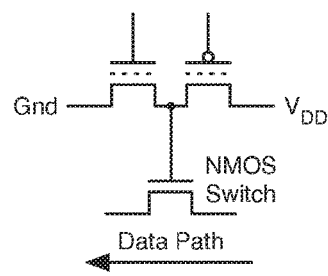
FIG. 3 is a diagram showing the use of prior art flash devices to control the gate of an NMOS pass device that serves as a switch.
Figure 4:
FIG. 4 is a diagram showing a generic representation of a prior art bipolar RRAM device.

In all of the embodiments disclosed above, it is presently preferred to deposit the dielectric using CVD techniques for repeatability, but persons of ordinary skill in the art will appreciate that PVD techniques may be acceptable as well. The critical dielectric and adjacent layers are preferably not deposited in a via hole, as was the case in some prior art RRAM structures such as FIGS. 1, 2 and 4 of U.S. Pat. No. 6,865,117. Depositing the materials in a via hole results in irregularities at the corners of the hole, as well as other problems. Instead the critical layers are formed by CVD (or PVD) deposition and etching.

Also, as shown in the various drawing figures illustrating the invention, the critical layers extend horizontally past the edges of the metal conductor (tungsten or copper via or wire) below. This is preferred to provide a higher yield structure with less chance of contamination or defects.

According to another aspect of the present invention, the RRAM devices disclosed herein may be particularly suitable for incorporating into switch cells for use as configuration memory or in other circuits such as multiplexers in programmable logic devices such as FPGAs. Persons of ordinary skill in the art will appreciate that some of the switch cells may also be useful with other types of NVM devices.

In order to create a programmable logic device such as an FPGA using an RRAM device structure, it is necessary to find a suitable way to use the structure to make a programmable switch. The configuration of a RRAM switch cell will depend somewhat on the characteristics of the RRAM device employed, as described below.

For RRAM devices that have high off resistance, have on resistance on the order of 10KΩ, or below, are not disturbed by logic signal currents in the on state, and have a sufficiently high threshold voltage to avoid disturb of the off state, two RRAM devices can be employed in a back-to-back configuration similar to the configuration disclosed in U.S. Pat. No. 7,402,847. However this requires that the limitations (mentioned above) of the prior art scheme are overcome as disclosed herein.

Figure 13:
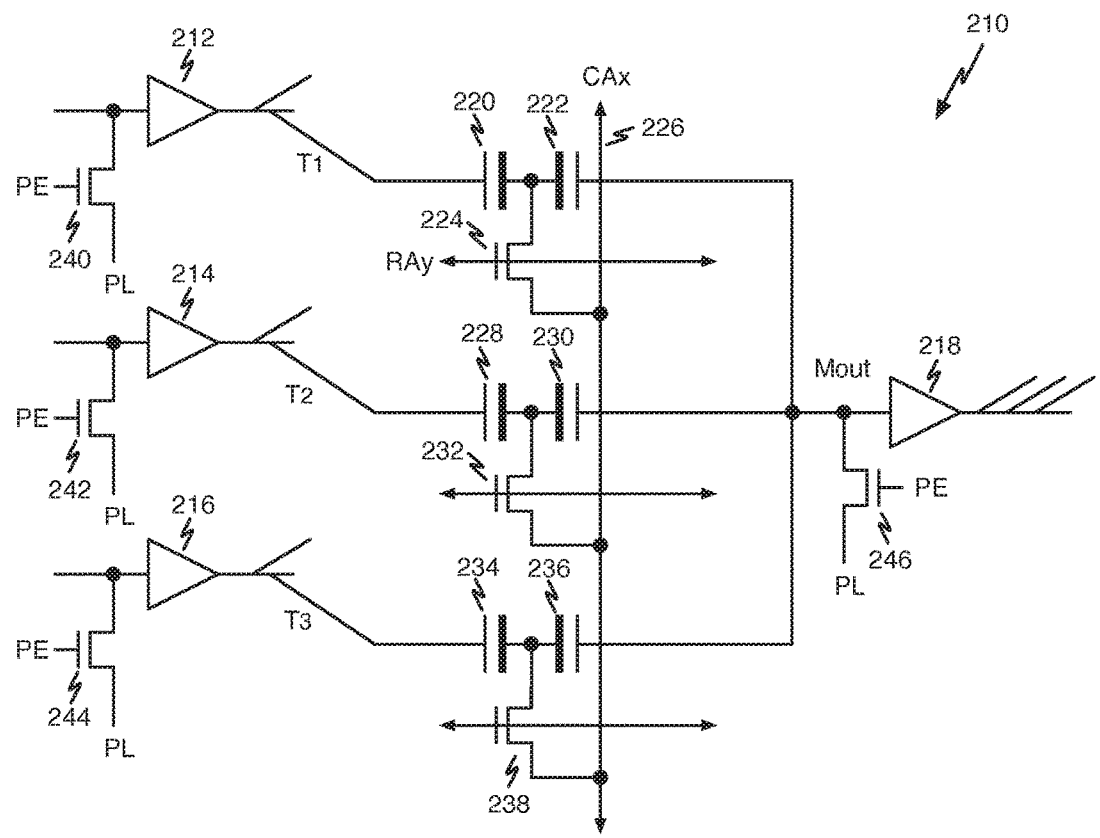
FIG. 13 is a diagram of an illustrative multiplexer according to the present invention.

According to one aspect of the present invention, an architecture for multiplexer cells may be implemented using back-to-back RRAM devices in accordance with the present invention. Referring now to FIG. 13, an illustrative embodiment of a multiplexer 210 formed using back-to-back RRAM according to the present invention is shown. While the particular example of FIG. 13 shows a three-input multiplexer, persons of ordinary skill in the art will appreciate that multiplexers having an arbitrary number of inputs can be fabricated using the principles of the present invention.

Multiplexer 210 has its inputs connected to routing tracks driven by buffers 212, 214, and 216. The output of multiplexer 210 drives buffer 218. Buffer 218 in turn drives another routing track. The routing track T1 driven by buffer 212 is coupled to a first back-to-back RRAM configuration including RRAM devices 220 and 222. The input of buffer 218 is coupled to the first back-to-back RRAM configuration. The drain of an address transistor 224 is coupled between the common terminals of the RRAM devices 220 and 222. Address transistor 224 is located in column x and row y. The gate of address transistor 224 is coupled to a row y address line RAy. The source of address transistor 224 is connected to a column x address line CAx indicated at reference numeral 226.

Similarly, the routing track T2 driven by buffer 214 is coupled to a second back-to-back RRAM configuration including RRAM devices 228 and 230. The input of buffer 218 is also coupled to the second back-to-back RRAM configuration. The drain of an address transistor 232 is coupled between the common terminals of the RRAM devices 228 and 230. The gate of address transistor 232 is coupled to another row address line. The source of address transistor 232 is coupled to the column x address line CAx at reference numeral 226. The routing track T3 driven by buffer 216 is coupled to a third back-to-back RRAM configuration including RRAM devices 234 and 236. The input of buffer 218 is also coupled to the third back-to-back RRAM configuration. The drain of an address transistor 238 is coupled between the common terminals of the RRAM devices 234 and 236. The gate of address transistor 238 is coupled to another row address line. The source of address transistor 238 is coupled to the column x address line CAx at reference numeral 226.

The input of each buffer 212, 214, 216, and 218 is provided with a single programming transistor, indicated at reference numerals 240, 242, 244, and 246, respectively. The gate of each programming transistor is tied to a program-enable signal PE and the source of each programming transistor is tied to a programming level signal PL. PE and PL may be global signals; it is not necessary to have separate signals to address individual buffers or even subsets of buffers, which results in a further area savings. Each of the buffers 212, 214, 216, and 218 themselves can be used to force their output to the same state as PL, so the programming transistors are only needed on half rather than all of the nets in contact with the programmable switches, saving area and complexity.

Figure 14:
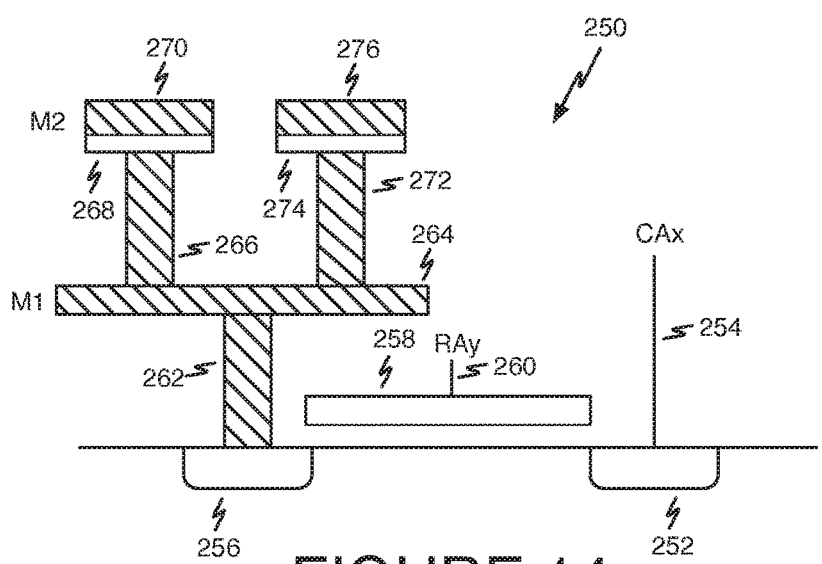
FIG. 14 is a cross sectional diagram of a back-to-back RRAM switch.

The common terminal of the two memory devices (220 and 222, 228 and 230, and 234 and 236) comprising each switch is preferentially (and in contrast to the prior art) the terminal connected to the lower layer of metal, as shown in FIG. 14. This facilitates connection of the common node to the addressing transistor. Also, the RRAM devices would preferably be between metal 1 and metal 2, rather than the upper layers of metal as in the prior art. This leaves the upper layers free for long-distance routing despite the heavy connectivity between the RRAM devices and the addressing transistors, provided at each common terminal.

Referring now to FIG. 14, a cross sectional diagram of a back-to-back RRAM switch 250 is disclosed. Diffusion 252 forms the source of the transistor, coupled to column address line CAx at reference numeral 254 and diffusion 256 forms its drain. Its gate 258 is coupled to the row-address line RAy at reference numeral 260. Contact 262 connects diffusion 256 to a portion of first metal layer 264. 266 couples the first metal layer 264 to terminal 268 of the first RRAM device. The second terminal 270 of the first RRAM device is formed from a portion of a second metal layer. 272 couples the first metal layer 264 to terminal 274 of the second RRAM device. The second terminal 276 of the first RRAM device is also formed from a portion of a second metal layer. The first terminals 268 and 274 of the RRAM devices are commonly connected to the segment 264 of the first metal line.

In order to avoid read disturb of the RRAM devices that are in the on state, the parasitic capacitance of the multiplexer output (Mout) must be kept as small as possible. Immediately buffering this signal before it drives other routing tracks helps achieve this goal. But this is not sufficient. The switches comprising the multiplexer and the buffer must be laid out very close together. With a good layout in 65 nm technology, the capacitance of Mout would probably be dominated by the input (gate) capacitance of the buffer, which typically is only a few fF. Each routing buffer can then fan out through a routing track to various switches in other multiplexers.

It is not required that all routing tracks (i.e. electrical nodes driven by a buffer or logic cell output) be linear in a horizontal or vertical direction. In fact, it is preferable that some of them be diagonal or tree-like to improve routability while minimizing parasitic capacitance.

The programmable switches shown in FIGS. 13 and 14 are arranged in an array of rows and columns. The gates of all addressing transistors for switches in row y are connected to a row address line RAy. The sources of all addressing transistors for switches in column x are connected to a column address line CAx. Persons of ordinary skill in the art will appreciate that, while FIG. 13 shows all switches in the multiplexer as being in the same column, that this is not necessarily the case. Such skilled persons will also appreciate that the roles of row and column lines may be swapped.

In a multiplexer such as the one depicted in FIG. 13, switch x,y may be programmed as follows. PE is raised. RAy is raised. PL is set to either logic 0 or 1 and CAx is driven to an appropriate voltage to apply the necessary forward or reverse bias to switch x,y to put it in the on or off state as desired. CAx' for all x'≠x is set to the same voltage as PL to avoid biasing unselected switches.

Of course programmable logic devices such as FPGAs contain logic cells such as look-up-tables or flip-flops as well as routing buffers. Additional circuitry analogous to the programming devices must be provided to ensure that logic cell inputs and outputs in contact with programmable switches are also driven to PL during programming. Persons skilled in the art will understand how to configure such additional circuitry according to the needs of any particular integrated circuit architecture.

A few variations are possible for controlling the voltage at the buffer inputs and outputs. In the above discussion, it has been assumed that PE can be raised high enough to pass logic 1 from PL to Mout. If this is a problem, a CMOS pass gate composed of a parallel p and n device may be used, instead of the single NMOS transistor as shown in FIGS. 13 and 14. In addition, depending on other aspects of the technology and circuit design, it may be possible to drive the CA lines to high enough and low enough voltages that it is not necessary to dynamically control PL. That is PL may be fixed at logic 0 or fixed at logic 1.

If a routing track is driven by an inverting routing buffer other ways are needed to force it to the desired state PL. For example, the routing buffers can be equipped with power switches or the buffers can be powered from a common switched supply. If the power supply ($V_{DD}$) of the buffer is switched, and it is desired to force the buffer outputs to ground for programming, a small pulldown device gated by PE can be added to pull the buffer output to ground. To enter programming mode, the power supply is turned off by lowering it to ground, then the pulldowns are activated to force the buffer outputs to 0. This technique is also applicable to logic cell outputs as well as all routing buffer outputs.

A few variations are possible for controlling the common terminals of the programmable switches. Although a single addressing transistor has been employed to drive the common terminals of the programmable switches, it may be necessary to use two transistors depending on the voltages required. For instance, a complementary pair of NMOS and PMOS transistors forming a CMOS pass gate may be used. In addition, a two-transistor capacitive boosting scheme, similar to the addressing devices in Actel antifuse FPGAs, may also be employed. The RA/CA and PE/PL addressing schemes may also be used to observe and/or control the circuitry in the FPGA for testing or debugging purposes.

If used with a synchronous FPGA, the back-to-back pairs of devices that are in an off state are subject to static stress since there may be logic 0 and logic 1 on opposite ends of the switch for an unlimited period during operation. Using asynchronous FPGA logic may be advantageous in that signals transition for short periods of time then return to a common resting state. This tends to reduce the static stress, at the cost of additional transitions.

Figure 15:
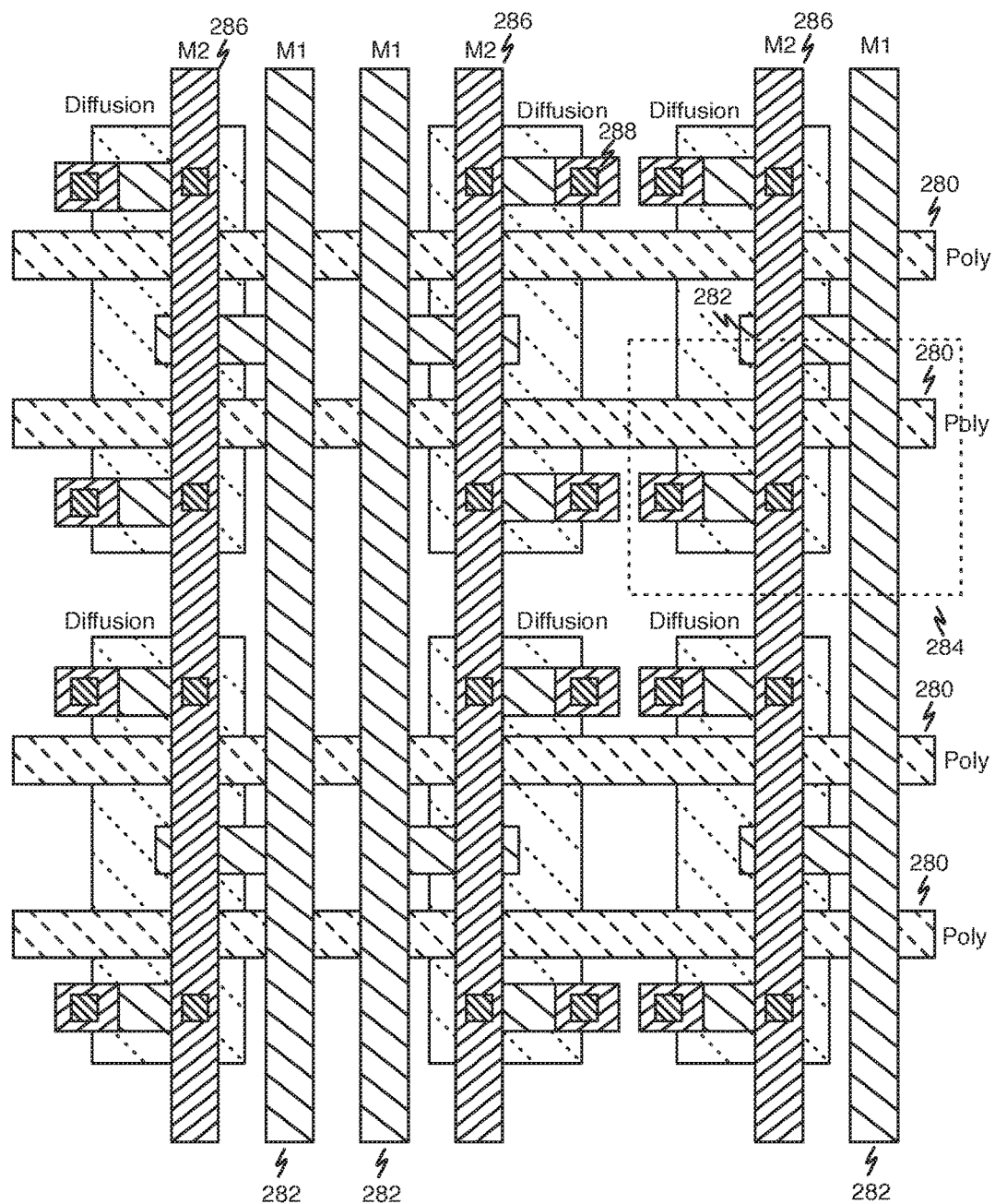
FIG. 15 is a layout diagram illustrating a simple, regular layout scheme for multiplexers according to the present invention.

As mentioned above, it is important to minimize the parasitic capacitance on Mout. This requires careful consideration of the layout of the RRAMs, addressing devices, and buffers. Referring now to FIG. 15, a general, regular layout scheme for the multiplexers is shown. The row-address lines 280 are run horizontally. One or more rows of switches are interspersed with rows of buffers and logic, so the logic does not interrupt the row-address lines and the row-address lines can run continuously across the array in polysilicon. The column address lines are shown running vertically at reference numerals 282 and are located in the metal 1 layer. A single switch cell is shown inside dashed lines 284. The buffer driven by a multiplexer output such as Mout is preferentially placed just above or below the corresponding switches. This way the Mout node is very compact, keeping its capacitance limited. Two of the adjacent Mout lines shown at reference numerals 286 running vertically in the metal 2 layer may be connected to reach even more switches without unduly lengthening the Mout line. Although the Mout lines 286 have been shown as continuous, they can be broken where necessary to form two or more smaller muxes. The pads of metal 2 provided for connecting the multiplexer inputs can easily be shared if adjacent multiplexers have common input signals. The routing tracks supplying inputs to the multiplexers would be routed on upper layers of metal, or metal 2 or metal 1 where it is still available. One of the RRAM devices is identified at reference numeral 288.

As is most easily seen from an examination of FIG. 14, because the common terminal of the two memory devices comprising a switch (reference numerals 268 and 274) is preferably connected to metal 1 (at reference numeral 264), it is easy to connect it to the corresponding addressing transistor. This is shown at reference numeral 288, where one of the horizontal fingers of the metal 1 layer passes under the metal 2 layer 286 used as Mout.

Figure 16:
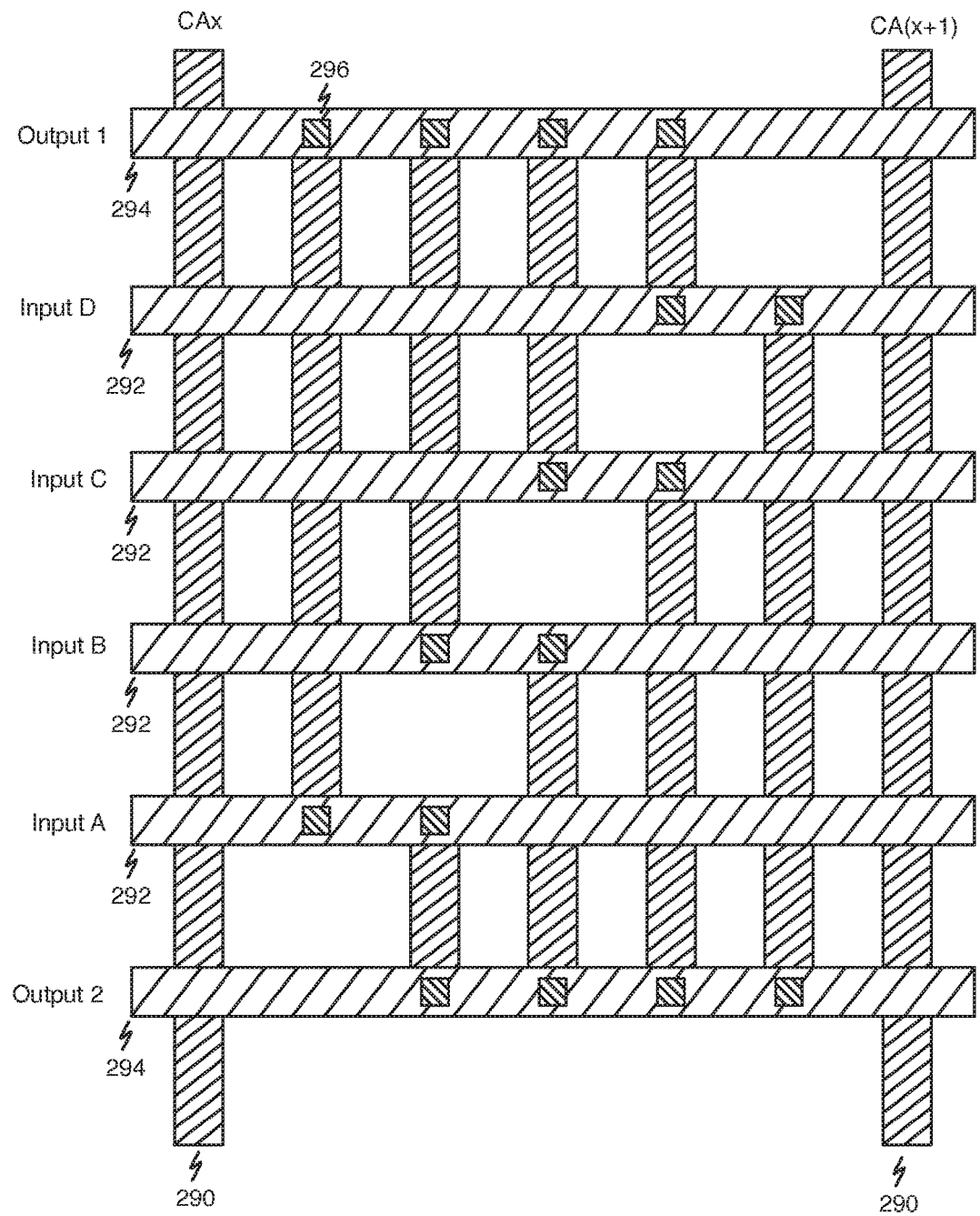
FIG. 16 is a layout diagram showing a first portion of a more dense layout for a multiplexer.
Figure 17:
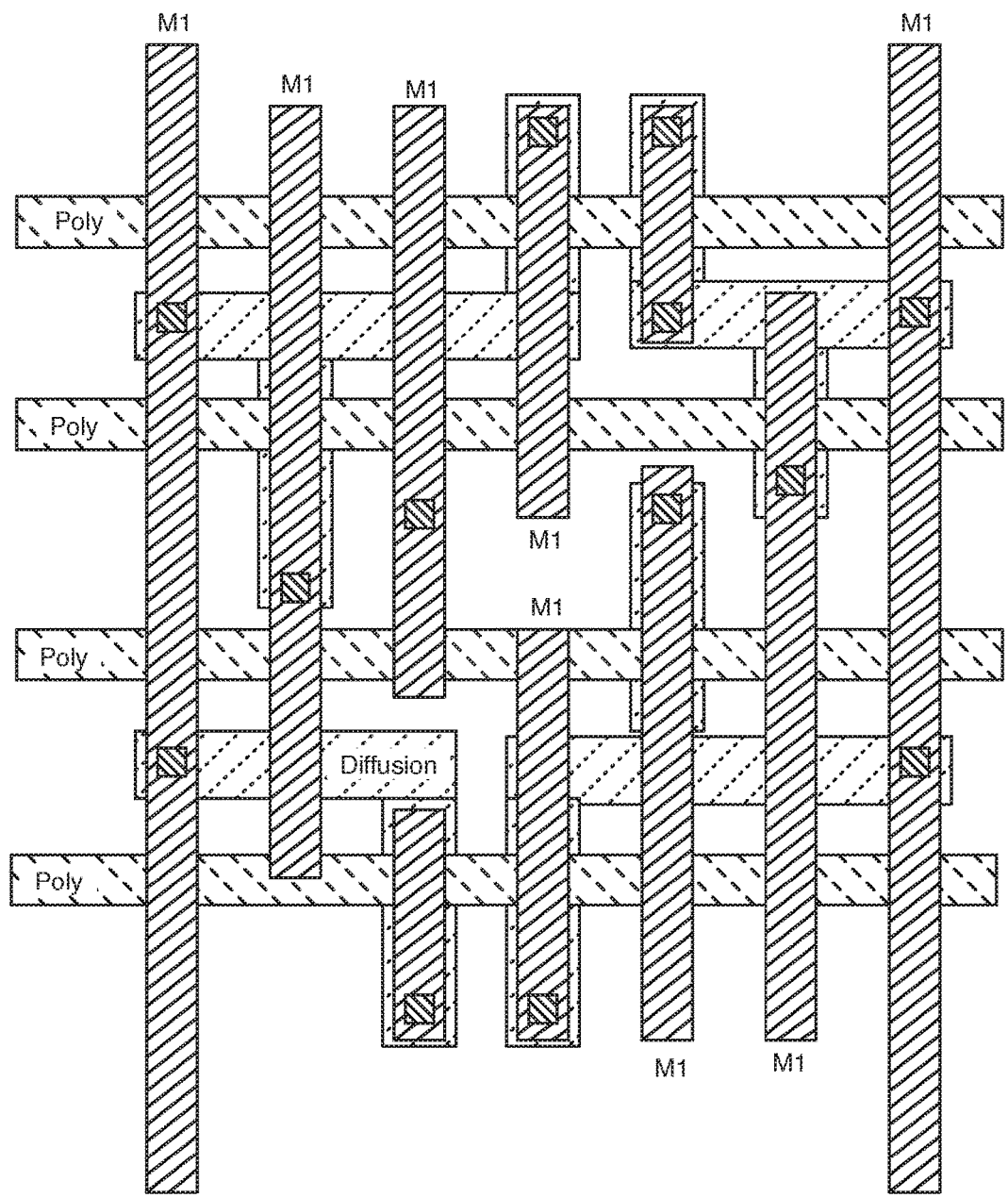
FIG. 17 is a layout diagram showing a second portion of the multiplexer layout of FIG. 16.

Referring now to FIGS. 16 and 17, even denser layout schemes are shown. FIG. 16 illustrates how metal 1, metal 2 and the switches are arranged to implement a 4-input by 2-output crossbar. The column address lines 290 run vertically in metal 1. The inputs 292 and outputs 294 run horizontally in metal 2. The outputs are available above and below the row of switches (one switch shown at reference numeral 296), so the corresponding routing buffer can be placed nearby. All metal 1 and metal 2 tracks run vertically and horizontally, respectively, which makes the layout efficient and manufacturable. If a full crossbar is not desired, the metal 2 lines can be broken to suit, with incoming signals delivered from higher layers of metal.

FIG. 17 includes the location of the RRAM devices, the polysilicon layers and the metal 1 layer. FIG. 17 shows how the addressing transistor devices can be laid out beneath the pattern of metal depicted in FIG. 16. The polysilicon layers define the transistors where they pass over the diffusion layers in the substrate.

The back-to-back RRAM cell of the present invention provides several advantages over the prior art. It reduces or eliminates read disturb of on switches by limiting maximum capacitance driven through any RRAM device. It replaces the separate tristate driver on each routing track required in the prior art with a single programming transistor, saving area. It avoids fighting between logic or routing buffer outputs and the tristate drivers used for programming in the prior art.

In addition, it halves number of programming devices required, by reusing routing buffers to bias half of the signals in contact with the switches. It eliminates the need to address subsets of routing tracks for programming rather than all of them at once. This can reduce programming time. The layout is optimized for density and to keep capacitance on Mout small. The common terminal of the two devices comprising a switch is connected to the lower rather than the upper layer of metal for improved layout density. Prior-art RRAM memories usually run the word lines in metal for good write speed. According to the present invention, the word (row-address) lines run continuously in poly for improved layout density.

According to another aspect of the present invention, a push-pull RRAM cell is disclosed. For RRAM devices that have a high off resistance but would be disturbed by logic signal voltages or currents, a push-pull cell can be used where the RRAM devices control an NMOS pass device. A basic push-pull RRAM cell, and some variations on it are described, as well as an additional push-pull cell specific to bipolar RRAM. The variations disclosed can be used independently or in combination.

Figure 18:
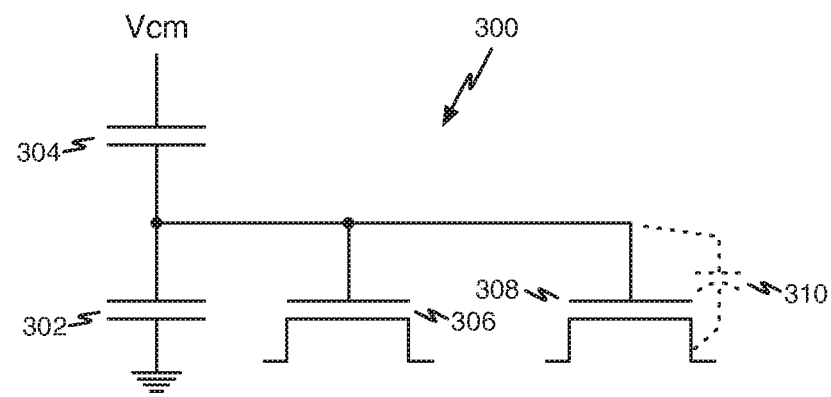
FIG. 18 is a schematic diagram shows a push-pull RRAM cell in accordance with one aspect of the present invention.

Referring now to FIG. 18, a schematic diagram shows an illustrative push-pull RRAM cell 300 in accordance with one aspect of the present invention. The RRAM devices 302 and 304 control one or more NMOS pass transistors 306 and 308 whose sources and drains are connected to routing tracks as known in the art (not shown) and which serve as programmable switches for the programmable logic device. When the FPGA or other programmable logic device is properly programmed, either one or the other but not both of the RRAM devices 302 and 304 is set to conduct.

One RRAM device 302 is coupled to ground and, when turned on, pushes the gates of the pass devices to ground to shut them off. The RRAM device 304 is coupled to a positive configuration memory voltage Vcm and, when turned on, pulls the gates of the pass devices up to the configuration memory voltage Vcm to turn them on. Whichever RRAM device is turned is off must not be disturbed by a DC stress from Vcm disposed across it. Whichever of RRAM devices 302 or 304 is turned on must not be disturbed by the currents due to the parasitic coupling capacitance (shown at reference numeral 310) as the logic signals on the sources and drains of the NMOS devices rise and fall. Techniques to adhere to these requirements are disclosed below.

As has been the practice with SRAM cells controlling pass devices in FPGAs, several alternatives are available to ensure that logic 1 signals are properly passed through the pass devices. The potential Vcm can be set somewhat higher than the $V_{DD}$ of the logic; this ensues the pass devices can pass the full level of $V_{DD}$. Or Vcm can be the same as $V_{DD}$, and a level restoring device can be provided on the output side of the pass devices. Alternately, a complementary PMOS pass device can be placed in parallel with the NMOS pass device to form a pass gate. The gate of the PMOS device must be produced by inverting the signal on the gate of the NMOS device, or by another push-pull pair programmed into the complementary state of the first pair.

Figures 19A, 19B:
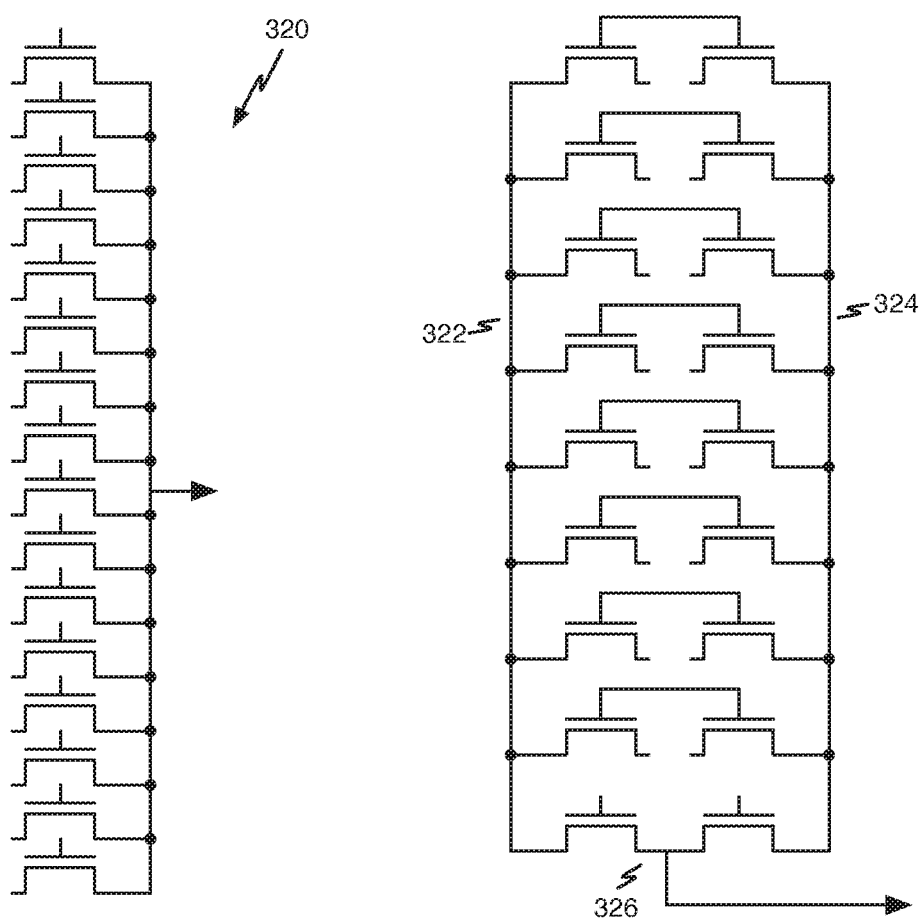
FIGS. 19A and 19B are diagrams showing alternative ways of forming multiplexers.

In some cases, it may be preferable to have multiple pass devices controlled by the same push-pull pair of NVM devices, reducing the area required for the NVM devices. This is especially effective for controlling the pass transistors in all but the last level of a multi-level multiplexer structure. This is illustrated in FIGS. 19A and 19B. For example, FIG. 19A shows a 16:1 multiplexer 320 implemented in a one level manner, and FIG. 19B shows a pair of 8:1 multiplexers 322 and 324 followed by a 2:1 multiplexer 326. In the two-level scheme of FIG. 19B, the gates of corresponding pass devices in the 8:1 multiplexers are joined, and so can be controlled by the a single push-pull circuit. However, persons of ordinary skill in the art will appreciate that, as the number of pass devices controlled by the same push-pull circuit increases, the risk of disturbing the NVM devices due to capacitive coupling increases. So a limit on the number of pass devices per push-pull circuit may need to be imposed.

For RRAM devices whose off state would be disturbed by a DC voltage of Vcm, one or more NMOS or PMOS series transistors can be added to the path to limit the voltage across the RRAM devices. An appropriate bias level must be provided on the gate of the series transistors during normal operation and during programming and erasing. This idea is described more fully in co-pending patent application Ser. No. 12/828,606, filed on the same day as the present application and incorporated herein by reference, which also discusses its application to other forms of NVM such as SONOS.

In seeking to reduce leakage in a push-pull cell, it may also be worth considering that in certain FPGA architectures, the majority (perhaps 90%) of the configuration cells will be programmed so that the pass devices are turned off. This is true, for example, of architectures based on multiplexers. In this case, it is more important to minimize leakage through the pullup RRAM device than through a pulldown RRAM device.

This can be taken advantage of when choosing polarity for a back-to-back push-pull cell, i.e. whether the back-to-back pull up and pull down devices should be connected with a common anode or common cathode. Prior art RRAM push-pull schemes connected the cathodes, which tends to promote leakage through the pullup device. Connecting the anodes (the terminal which must be positive to program the device to a low resistance state) reduces the total leakage when most cells are programmed to turn the pass devices off, and the common terminal is at a low voltage.

FIG. 18 did not specify the polarity of the RRAM devices. But if the RRAM device is bipolar, the RRAM devices can be connected in a front-to-back manner to avoid disturb of the off device. Referring now to FIG. 20, a diagram illustrates a front-to-back push-pull cell 330 according to the present invention in more detail.

Push-pull cell 330 includes RRAM devices 332 and 334 coupled between potentials VP and VN at reference numerals 336 and 338 respectively. Programming transistor 340 is coupled between potential VS and the common terminal G of RRAM deices 332 and 334. The gate of programming transistor 340 is coupled to a word line W. Push-pull cell 330 is shown driving the gates of two switch transistors 342 and 344, although persons skilled in the art will appreciate that different numbers of switch transistors could be employed depending on circuit needs.

During normal operation: W=0, VP=Vcm, VN=0V. To turn on the switch, the pullup device 332 is programmed and the pulldown device 334 is erased so that the gates of switch transistors 342 and 344 are high. To turn off the switch, the pulldown device 334 is programmed and the pullup device is erased so that the gates of switch transistors 342 and 344 are low. During normal operation, whichever of devices 332 and 334 is off sees voltage stress only in the reverse direction. This avoids disturbing the state of the off device.

Referring now to FIGS. 21 and 22, cross sectional views of two alternative cell layouts are shown. FIG. 21 shows a "back-to-back" arrangement (with the polarity of the pulldown device reversed relative to FIG. 20). This uses only two metal pitches, and so would be preferred if read disturb of the off device is not an issue. In the FIG. 21 embodiment, diffusion 352 serves as the source of programming transistor 340 (FIG. 20) and is coupled to the potential VS. Diffusion 354 serves as the drain of the programming transistor. Polysilicon line 256 serves as the gate of the programming transistor and as a word line. Diffusion 358 serves as the source of one of the switch transistors of FIG. 20. Diffusion 360 serves as the drain of the switch transistor. Polysilicon line 362 serves as the gate of the switch transistor.

Contact 364 connects the drain of the programming transistor to a segment 366 of a metal-1 line. Contact 368 connects the gate 362 of the switch transistor to metal-1 line segment 366. Contact 370 connects metal-1 line segment 366 to the anode of RRAM device 372. Contact 374 connects the cathode of RRAM device 372 to metal-2 line segment 376.

Via 378 connects metal-1 line segment 366 to the anode of RRAM device 380. Via 382 connects the cathode of RRAM device 380 to metal-2 line segment 384.

In the push-pull cell 390 of the FIG. 22 embodiment, diffusion 392 serves as the source of programming transistor 340 (FIG. 20) and is coupled to the potential VS. Diffusion 394 serves as the drain of the programming transistor. Polysilicon line 396 serves as the gate of the programming transistor and as a word line. Diffusion 398 serves as the source of one of the switch transistors of FIG. 20. Diffusion 400 serves as the drain of the switch transistor. Polysilicon line 402 serves as the gate of the switch transistor.

Contact 404 connects the drain of the programming transistor to segment 406 of metal-1 line 406. Contact 408 connects the gate 402 of the switch transistor to metal-1 line segment 406. Contact 410 connects metal-1 line segment 406 to the anode of RRAM device 412. Contact 414 connects the cathode of RRAM device 412 to metal-2 line segment 416, which is coupled to VP.

Contacts 418 and 420 connect metal-1 line segment 406 to the cathode of RRAM device 422 through metal-2 line segment 424. Contact 426 connects the anode of RRAM device 422 to metal-1 line segment 428, which is coupled to VN.

Persons of ordinary skill in the art will appreciate that FIG. 22 shows a "front-to-back" arrangement of RRAM devices 412 and 422, reflecting the polarities shown in the schematic diagram of FIG. 20. The embodiment shown in FIG. 22 takes slightly more area, but, because the RRAM devices 412 and 422 are arranged in a "front-to-back" configuration, avoids disturbing whichever device is off during normal operation.

The above discussion has assumed that disturbing the off device is the greater danger. However it is possible that for some RRAM technologies disturbing the on device is a greater danger. In this case the polarities of both devices may be reversed to avoid disturbing whichever device is on, instead of whichever device is off.

If it is assumed that the threshold to program or erase an RRAM is about 2V, then to globally erase all pullup devices without disturbing the pulldowns, W is set high, VS is set to 0V, VP is set to 2V, and VN is set to 0V. To globally erase all pulldown devices without disturbing the pullups, W is set high, VS is set to 2V, VP is set to 2V, and VN is set to 0V In all cases, W is a word line controlling a row of switch cells. However there are two possibilities for how to connect VP, VN and VS. According to a first alternative, VS is global and VP and VN are dual bit lines controlling a column of switch cells. To program a pullup device and erase (or maintain the erased state of) the corresponding pulldown device, W is set high (selected) or low (unselected), VS is set to 2V, VP is set to 0V (selected) or 2V (unselected), and VN is set to 0V (selected) or 2V (unselected). If the selected pulldown is already erased, the selected VN might be raised above 0V as long as it does not become so high as to disturb erased devices in the selected column.

To program a pulldown device and erase (or maintain the erased state of) the corresponding pullup device, W is set high (selected) or low (unselected), VS is set to 0V, VP is set to 2V (selected) or 0V (unselected), and VN is set to 2V (selected) or 0V (unselected). If the selected pullup is already erased, the selected VP might be lowered below 2V as long as it does not become so low as to disturb erased devices in the selected column.

This alternative has the disadvantage of requiring two bit lines per column, which complicates the layout. According to a second alternative, VS is the bit line and VP and VN are global signals. To program a pullup device and erase (or maintain the erased state of) the corresponding pulldown device, W is set high (selected) or low (unselected), VS is set to 2V (selected) or 0V (unselected), VP is set to 0V, and VN is set to 0V. If the selected pulldown is already erased, VN might be raised above 0V as long as it does not become so high as to disturb erased devices.

To program a pulldown device and erase (or maintain the erased state of) the corresponding pullup device, W is set high (selected) or low (unselected), VS is set to 0V (selected) or 2V (unselected), VP is set to 2V, and VN is set to 2V. If the selected pullup is already erased, VP might be lowered below 2V as long as it does not become so high as to disturb erased devices.

Table 1 summarizes the programming/erasing tasks and the applied voltages under both alternative connection schemes. Note that selective erasing may be done without programming. However, in the second alternative this requires some care to avoid inadvertently disturbing unselected programmed devices (see starred entries), such as precharging the bit lines to 1V or some other suitable voltage between 0 and 2V. Each entry in the table has three symbols specifying the state of VP, G (the gate of the relevant switches), and VN, respectively.

TABLE 1

| Task | | Row/ | Alt: VS Global | | Alt: VP, VN Global | |
|---|---|---|---|---|---|---|
| | | | Select VP, G, VN | Unselect VP, G, VN | Select VP, G, VN | Unselect VP, G, VN |
| Program | Erase | col | VN | VN | VN | VN |
| pullup | pulldown | select | 020 | 222 | 020 | 000 |
| | | unselect | 0x0 | 2x2 | 0x0 | 0x0 |

TABLE 1-continued

| Task | | Row/ | Alt: VS Global | | Alt: VP, VN Global | |
|---|---|---|---|---|---|---|
| | | | Select VP, G, VN | Unselect VP, G, VN | Select VP, G, VN | Unselect VP, G, VN |
| Program | Erase | col | VN | VN | VN | VN |
| pulldown | pullup | select | 202 | 000 | 202 | 222 |
| | | unselect | 2x2 | 0x0 | 2x2 | 2x2 |
| | pullup | select | 200 | 000 | 200 | 210* |
| | | unselect | 2x0 | 0x0 | 2x0 | 2x0 |
| | pulldown | select | 220 | 222 | 220 | 210* |
| | | unselect | 2x0 | 2x2 | 2x0 | 2x0 |
| | All pullups In row | select unselect | 200 2x0 | | 200 2x0 | |
| | All pulldowns in row | select unselect | 220 2x0 | | 220 2x0 | |

Legend:
2 = 2 V
1 = Connected to floating bit line, which has been precharged to 1 V (or about ½ the programming voltage)
0 = 0 V
x = Driven only by pullup or pulldown devices, addressing device turned off The front-to-back cell of the present invention has several advantages. It allows front-to-back arrangement of bipolar RRAM devices to take advantage of their asymmetrical nature to avoid disturb. It permits applying voltages as shown in Table 1, especially for the programming task. It allows for two particular schemes for assigning VS, VP and VN to global or bit lines. A pair of RRAM devices may control multiple switches (pass devices). RRAM memories usually run the word lines in metal for good write speed. Here, the word (W) lines may be run continuously in poly for improved layout density.

Figure 23:
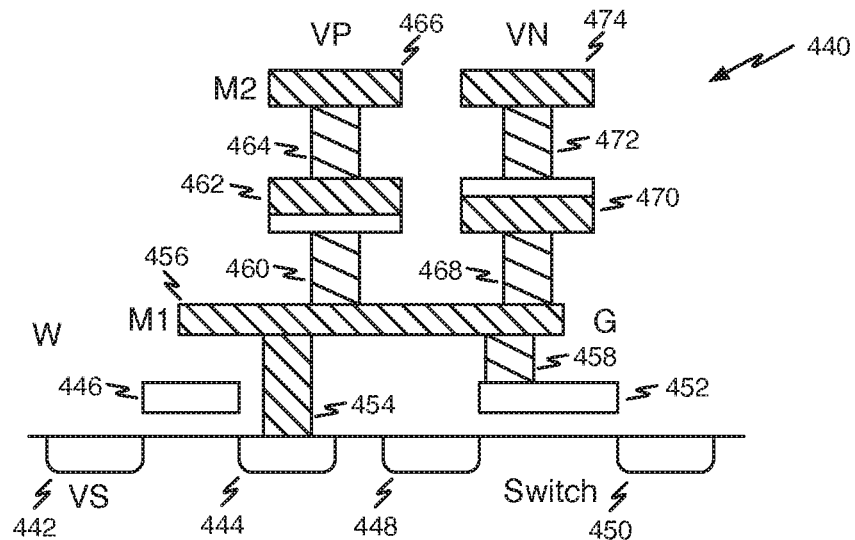
FIG. 23 is a cross sectional view of a first additional alternative structure for the front-to-back cell according to the present invention.
Figure 24:
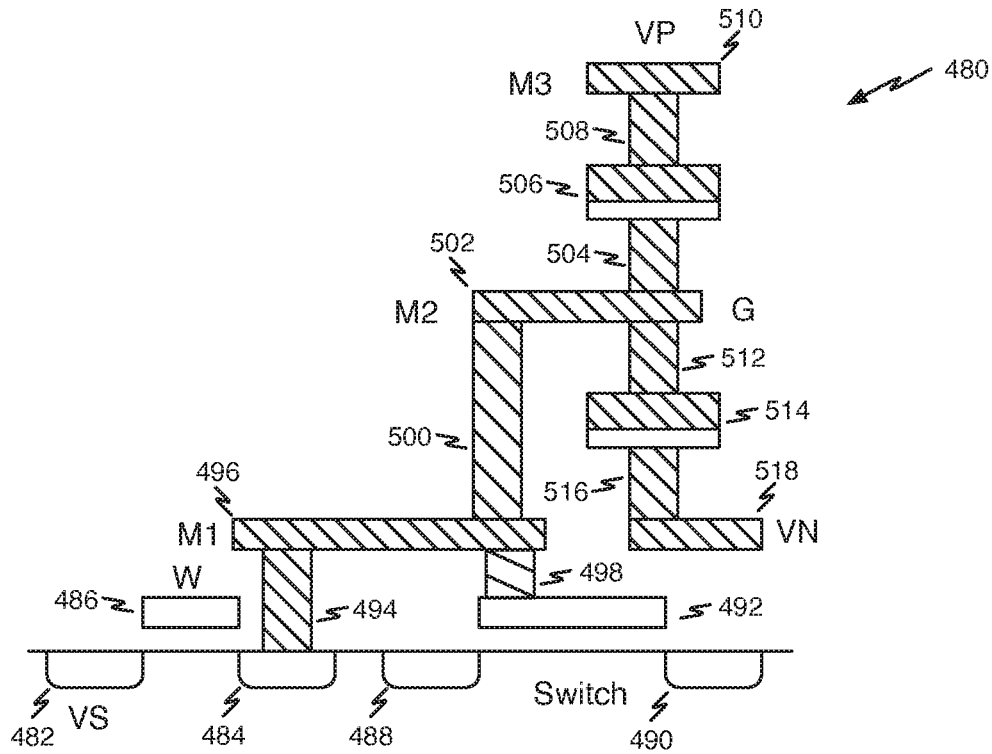
FIG. 24 is a cross sectional view of a second additional alternative structure for the front-to-back cell according to the present invention.

Referring now to FIGS. 23 and 24, FIG. 23 shows two additional alternative structures for the front-to-back cell in a side view. These are intended to eliminate the area penalty imposed by the front-to-back topology. The structure shown in FIG. 23 uses distinct masking to create RRAM devices of both polarities between metal 1 and metal 2. The structure in FIG. 24 places RRAM devices in the same orientation between metal 1 and metal 2, and between metal 2 and metal 3.

The push-pull cell 440 of FIG. 23 shows a "front-to-back" arrangement that uses only two metal pitches. In the FIG. 23 embodiment, diffusion 442 serves as the source of the programming transistor and is coupled to the potential VS. Diffusion 444 serves as the drain of the programming transistor. Polysilicon line 446 serves as the gate of the programming transistor and as a word line. Diffusion 448 serves as the source of one of the switch transistors. Diffusion 450 serves as the drain of the switch transistor. Polysilicon line 452 serves as the gate of the switch transistor. Contact 454 connects the drain of the programming transistor to a segment 456 of a metal-1 line. Contact 458 connects the gate 452 of the switch transistor to metal-1 line segment 456. Contact 460 connects metal-1 line segment 456 to the anode of RRAM device 462. Contact 464 connects the cathode of RRAM device 462 to metal-2 line segment 466.

Contact 468 connects metal-1 line segment 456 to the cathode of RRAM device 470. Contact 472 connects the anode of RRAM device 470 to metal-2 line segment 474.

In the push-pull cell 480 of the FIG. 23 embodiment, diffusion 482 serves as the source of the programming transistor and is coupled to the potential VS. Diffusion 484 serves as the drain of the programming transistor. Polysilicon line 486 serves as the gate of the programming transistor and as a word line. Diffusion 488 serves as the source of one of the switch transistors of FIG. 20. Diffusion 490 serves as the drain of the switch transistor. Polysilicon line 492 serves as the gate of the switch transistor.

Via 494 connects the drain of the programming transistor to a segment 496 of a metal-1 line. Via 498 connects the gate 492 of the switch transistor to metal-1 line segment 496. Via 500 connects metal-1 line segment 496 to a segment 502 of a metal-2 line. A contact 504 connects segment 502 of the metal-2 line to the anode of RRAM device 506. Via 508 connects the cathode of RRAM device 506 to a segment 510 of a metal-3 line.

Via 514 connects metal-2 line segment 504 to the cathode of RRAM device 516. Via 518 connects the anode of RRAM device 516 to metal-1 line segment 520.

Figure 25:
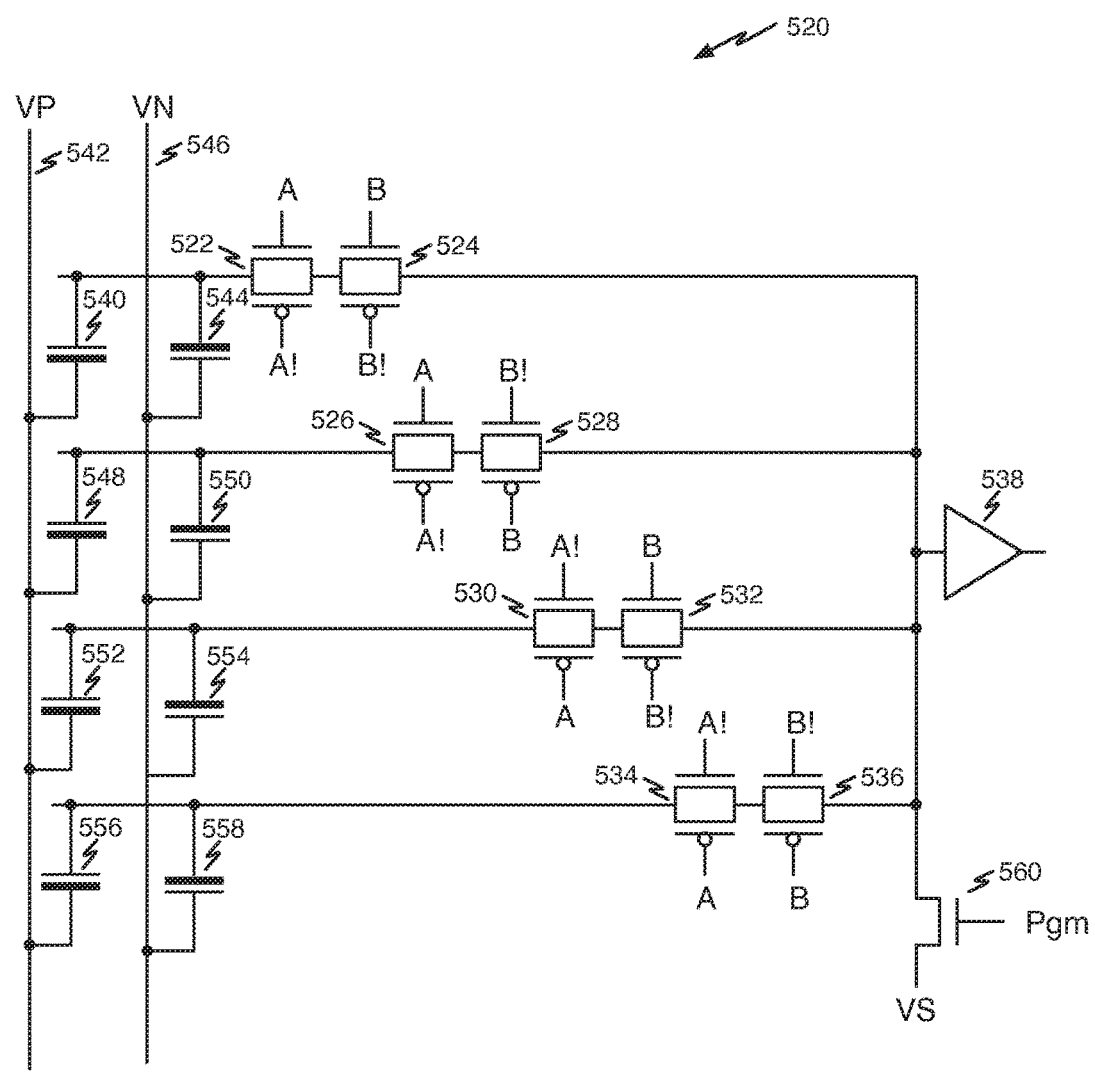
FIG. 25 is a schematic diagram showing front-to-back push-pull pairs of bipolar RRAM devices used to configure a look-up table (LUT) without the usual addressing devices.

Referring now to FIG. 25, a schematic diagram shows a variation of the front-to-back RRAM arrangement, specifically how front-to-back push-pull pairs of bipolar RRAM devices may be used to configure a look-up table (LUT) without the usual addressing devices. Instead, the multiplexer comprising the look-up table is used to address the RRAM devices. During operation of the FPGA, VP is set to $V_{DD}$ (normal logic power supply) and VN to ground (normal logic ground).

More specifically, LUT 520 includes pairs of series connected pass gates. A first pair of pass gates includes pass gates 522 and 524. A second pair of pass gates includes pass gates 526 and 528. A third pair of pass gates includes pass gates 530 and 532. A fourth pair of pass gates includes pass gates 534 and 536. The pass gates are all coupled to the input of output buffer 538. The connections of the LUT terms A, A!, B, and B! terms to the gates of the n-channel and p-channel devices in the pass gates is shown in FIG. 24.

The input to the first pair of pass gates 522 and 524 is connected to a first RRAM device 540 coupled to VP line 542 and to a second RRAM device 544 coupled to VOP line 546. The common node of the RRAM devices 540 and 544 are oriented front-to-back.

Similarly, the input to the second pair of pass gates 526 and 528 is connected to a first RRAM device 548 coupled to VP line 542 and to a second RRAM device 550 coupled to VP line 546. The common node of the RRAM devices 548 and 550 are oriented front-to-back. The input to the third pair of pass gates 530 and 532 is connected to a first RRAM device 552 coupled to VP line 542 and to a second RRAM device 554 coupled to VP line 546. The common node of the RRAM devices 552 and 554 are oriented front-to-back. The input to the fourth pair of pass gates 534 and 536 is connected to a first RRAM device 556 coupled to VP line 542 and to a second RRAM device 558 coupled to VP line 546. The common node of the RRAM devices 556 and 558 are oriented front-to-back.

A programming transistor 560 has its drain connected to the common connection of the pass gates at the input of the output buffer 536. The source of the programming transistor 536 is connected to the potential VS. Its gate is connected to a PGM signal. The RRAM devices in FIG. 25 may be programmed as described in TABLE 1, except that instead of selecting a row using the word line W we select a row by setting A and B to the corresponding pair of values. For example, to select RRAM devices 540 and 544 we would set A and B high. In addition the programming enable signal Pgm must be set high to turn on device 560. Care must be taken that the voltage on VS does not exceed values that are safe for the pass gates and the input of buffer 538.

According to another aspect of the present invention, a flexible programming method may be advantageously employed. Certain types of RRAM cells, such as solid electrolyte, have a tradeoff between endurance and retention. If programmed strongly (with a larger voltage or current to achieve a lower on resistance or higher off resistance), they will have long retention times. However they cannot be programmed strongly very many times. Conversely, if programmed weakly, they will have shorter retention times, but still be able to be programmed many more times.

When RRAM is used in FPGAs, this tradeoff can be advantageously employed as follows. During development of a design, the user may need to program many prototype designs, yet retention is not a concern. So weak programming is best. Then once the design is finalized and ready for production, the FPGA can be programmed strongly to achieve longer retention time.

Weak and strong programming levels can vary depending on the materials used. In this case with a Silver electrode and GeS dielectric weak programming is typically less than 10 uA with a pulse in the microsecond or longer range of tine. The filament will be more robust with a programming pulse of greater than 100 uA in the microsecond or longer range of time.

The availability of RRAM enables the addition of useful new features to an RRAM FPGA. FPGA users can benefit from incorporating non-volatile memory (NVM) blocks into the FPGA as a supplement to the customary SRAM memory blocks. The bit cell of the NVM blocks will be substantially smaller than an SRAM bit cell, so that the NVM blocks may offer more area-efficient storage, e.g. for coefficients for a DSP engine or program storage for embedded soft or hard processors. A simple implementation would allow the NVM blocks to be written only when the FPGA is programmed. A more complex implementation would allow the NVM blocks to be written by the user's design during normal operation, enabling the NVM blocks to be used in addition for purposes such as storing adapted coefficients, error logging or storing state prior to power-down.

Non-volatile memory blocks are generally single-ported. However for use in an FPGA fabric it may be beneficial to make them able to support two independent read ports (e.g. for program storage) or an independent read and write port.

Another use of RRAM within an FPGA contemplated by the present invention is to provide one bit of RRAM storage in association with each flip-flop or other state-holding element in the FPGA fabric. If it is necessary to power down the FPGA (e.g. to enter a low-power standby mode) the state may be saved into the RRAM bits and then read back to reinitialize the flip-flop upon power-up. The transfer of data from the flip-flops to and from the RRAM bits may take place either fully or partly (e.g., by rows) in parallel to save time.

Because RRAM can be programmed with low voltage and relatively simple row and column drivers, it is better suited to these purposes than other NVM technologies with larger overhead, such as flash. Because the NVM blocks will be relatively small in bit capacity compared to prior art NVM blocks (perhaps comparable in capacity to the SRAM blocks commonly embedded in FPGA fabrics), it may be beneficial to take steps to further reduce the area of overhead circuitry such as charge pumps, row/column drivers and sense amps even at the expense of slightly increasing the RRAM bit cell area. For instance, using two devices per bit may allow a larger programming window and thus simpler overhead circuitry.

Small blocks of RRAM memory bits which can be associated with SRAMs, Latches, and Registers where in the volatile logic state will be lost if the part is powered down. Normally these might be whole conventional memory blocks in which the part takes many micro to milliseconds to save the state of the logic due to the need for complicated series of addresses/writes/verifies for each logic bit or group of logic bits.

Figures 26, 27:
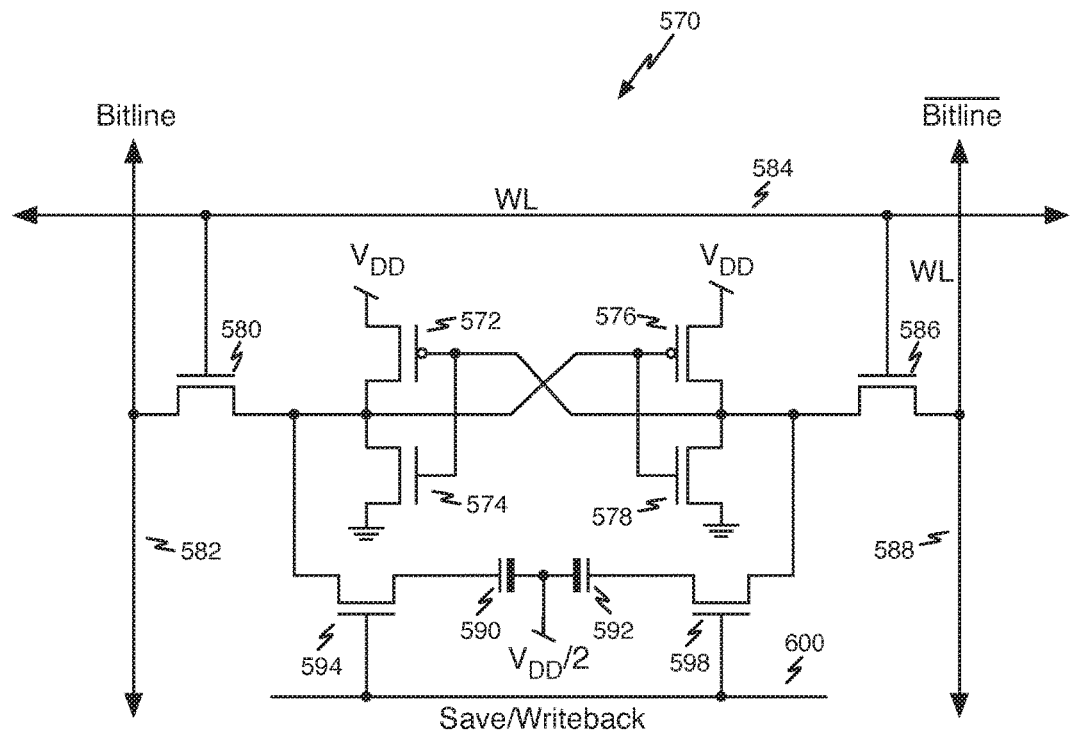
FIG. 26 is a schematic diagram of an illustrative nonvolatile memory constructed around a resistive random-access memory cell according to one aspect of the present invention.
FIG. 27 shows a possible arrangement of RAM blocks, NVM blocks and logic tiles to form an FPGA core according to the present invention.

According to another aspect of the present invention, a micro RAM cell can be fabricated using the RRAM cell of the present invention. Referring now to FIG. 26, RAM cell 570 may be used with a familiar volatile memory including a cross-coupled structure including a first p-channel transistor 572 in series with a first n-channel transistor 574 between $V_{DD}$ and ground. The gates of the first p-channel transistor 572 and the first n-channel transistor 574 are connected together. A second p-channel transistor 576 is connected in series with a second n-channel transistor 578 between $V_{DD}$ and ground. The gates of the second p-channel transistor 576 and the second n-channel transistor 578 are connected together. The common drain connections of the first p-channel transistor 572 and the first n-channel transistor 574 form a first sense node and are connected to the commonly connected gates of the second p-channel transistor 576 and the second n-channel transistor 578. The common drain connections of the second p-channel transistor 576 and the second n-channel transistor 578 form a second sense node and are connected to the commonly connected gates of the first p-channel transistor 572 and the first n-channel transistor 574.

The first sense node is connected to a first bit line 580 through a transistor 582. The gate of the transistor 582 is connected to a word line 584. The second sense node is connected to a second complementary bit line 586 through a transistor 588. The gate of the transistor 588 is connected to the word line 584.

A RRAM cell according to the present invention is formed from a pair of RRAM devices 590 and 592 and is coupled to the cross-coupled structure just described. The common node of the RRAM devices 590 and 592 is coupled to a potential such as $V_{DD}/2$. The RRAM device 590 is coupled to the first sense node through a transistor 594. The gate of the transistor 594 is connected to a SAVE/WRITE-BACK line 596. The RRAM device 592 is coupled to the second sense node through a transistor 598. The gate of the transistor 598 is connected to the SAVE/WRITEBACK line 596. The programming voltage is about ½ volt and in save condition the common node of RRAM devices 590 and 592 is raised to ½ $V_{DD}$ causing opposite states to be written into RRAM devices 590 and 592.

Referring now to FIG. 27, a possible arrangement of RAM blocks, NVM blocks and logic tiles to form an FPGA core is shown. The tiles are preferably arranged in rows of a single type so that they can be pitch matched. There may be one or more rows of each type of memory. The rows of RAM, NVM, and logic may occur in any order. The tiles are all shown as having the same width and height, but this is not necessarily the case. The height of each tile (RAM, NVM and logic) may all be different. The widths are preferably multiples of some common unit width. The programmable routing could be integrated into the tiles, or run between and/or over or through them.

As shown in FIG. 26, small complimentary NVM bits can be associated with small/individual volatile memory/logic as the save state and read back operation are complimentary and therefore do not require complicated write and sense operations. In fact the memory bit shown can act as a sense amplifier for the associated NVM bit. One advantage of such an arrangement is that the state can be saved in nanoseconds by a single pulse on the save line and when powering up the logic the Save line is asserted first such that the differential impedance of the RRAM will set the logic bit to the correct state. Persons of ordinary skill in the art can recognize that the simplicity of the complimentary bit can be applied to other NVM technologies.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A resistive random-access memory device formed on a semiconductor substrate and comprising:
    an interlayer dielectric formed over the semiconductor substrate and having a first via formed therethrough;
    a chemical-mechanical-polishing stop layer formed over the interlayer dielectric, the first via formed through the chemical-mechanical-polishing stop layer;
    a lower metal layer formed in the first via, top surfaces of the chemical-mechanical-polishing stop layer and the lower metal layer forming a substantially planar top surface;
    a dielectric layer formed over the chemical-mechanical-polishing stop layer and in electrical contact with the lower metal layer;
    a barrier metal layer formed over the dielectric layer;
    edges of the dielectric layer and the barrier metal layer being in substantial alignment with each other to form an aligned stack disposed directly over the lower metal layer, edges of the aligned stack extending beyond outer edges of the first via;
    a dielectric barrier layer formed over the aligned stack and at least a portion of the chemical-mechanical-polishing stop layer, the dielectric barrier layer including a second via formed therethrough communicating with the barrier metal layer; and
    an upper metal layer formed in the second via and in electrical contact with the barrier metal layer.

2. The resistive random-access memory device of claim 1 further comprising:
    a first barrier metal liner lining side and bottom walls of the first via and in contact with the lower metal layer; and
    a second barrier metal liner lining side and bottom walls of the second via and in contact with the upper metal layer.

3. The resistive random-access memory device of claim 1 wherein the barrier metal layer is formed from one of Ta, TaN, Ti, TiN, and W.

4. The resistive random-access memory device of claim 1 wherein the chemical-mechanical-polishing stop layer is formed from one of SiN and SiC.

5. The resistive random-access memory device of claim 1 wherein the dielectric layer is formed from one of GeS, a chalcogenide material, and a glass material.

6. The resistive random-access memory device of claim 1 wherein the dielectric barrier layer is formed from SiN and SiC.

7. The resistive random-access memory device of claim 2 wherein;
    the lower metal layer is formed from Cu; and
    the first barrier metal liner is formed from one of Ta, TaN, Ti, and TiN.

8. The resistive random-access memory device of claim 7 wherein;
the upper metal layer is formed from Cu; and
the second barrier metal liner is formed from one of Ta, TaN, Ti, and TiN.

9. The resistive random-access memory device of claim 1 further including a second interlayer dielectric separating a first metal interconnect layer and a second metal interconnect layer in an integrated circuit formed on the semiconductor substrate.

10. The resistive random-access memory device of claim 1 wherein:
the lower metal layer includes a seam forming a void; and
the void is filled with a filler material.

11. The resistive random-access memory device of claim 10 wherein the filler material is chosen from one of SiO2, SiN, barrier metals including Ti, Ta, W, TiN, TaN, and a metal.

12. A resistive random-access memory device formed on a semiconductor substrate and comprising:
a first interlayer dielectric formed on the semiconductor substrate and having a first via formed therethrough;
a chemical-mechanical-polishing stop layer formed over the first interlayer dielectric, the first via formed through the chemical-mechanical-polishing stop layer;
a lower metal layer formed in the first via, a top surface of the lower metal layer extending above a top surface of the chemical-mechanical-polishing stop layer;
a first barrier metal layer formed over the chemical-mechanical-polishing stop layer and the top surface of the lower metal layer, the first barrier metal layer in electrical contact with the lower metal layer;
a dielectric layer formed over the first barrier metal layer;
an ion source layer formed over the dielectric layer;
edges of the first barrier metal layer, the dielectric layer, and the ion source layer extending beyond outer edges of the first via;
a second interlayer dielectric formed over the ion source layer extending past the edges of the first barrier metal layer, the dielectric layer, and the ion source layer, the second interlayer dielectric including a second via formed therethrough communicating with the ion source layer; and
an upper metal layer formed in the second via.

13. The resistive random-access memory device of claim 12 further comprising:
a first barrier metal liner lining side and bottom walls of the first via and in contact with the lower metal layer, the first barrier metal liner and the lower metal layer forming a substantially planar top surface;
a dielectric barrier layer formed over the first barrier metal layer, the dielectric layer, and the ion source layer and at least a portion of the chemical-mechanical-polishing stop layer, the dielectric barrier layer including a second via formed therethrough communicating with the barrier metal layer; and
a second barrier metal liner lining side and bottom walls of the second via and in contact with the upper metal layer.

14. The resistive random-access memory device of claim 12 wherein the barrier metal layer is formed from one of Ta, TaN, Ti, TiN, and W.

15. The resistive random-access memory device of claim 12 wherein the chemical-mechanical-polishing stop layer is formed from one of SiN and SiC.

16. The resistive random-access memory device of claim 12 wherein the dielectric layer is formed from one of GeS, a chalcogenide material, and a glass material.

17. The resistive random access memory device of claim 12 wherein the ion source is formed from Ag.

18. The resistive random-access memory device of claim 12 wherein the dielectric barrier layer is formed from SiN and SiC.

19. The resistive random-access memory device of claim 12 wherein;
the lower metal layer is formed from Cu; and
the first barrier metal liner is formed from one of Ta, TaN, Ti, and TiN.

20. The resistive random-access memory device of claim 19 wherein;
the upper metal layer is formed from Cu; and
the second barrier metal liner is formed from one of Ta, TaN, Ti, and TiN.

21. The resistive random-access memory device of claim 12 wherein the second interlayer dielectric is a dielectric layer separating a first metal interconnect layer and a second metal interconnect layer in an integrated circuit formed on the semiconductor substrate.

22. The resistive random-access memory device of claim 12 wherein:
the lower metal layer includes a seam forming a void; and
the void is filled with a filler material.

23. The resistive random-access memory device of claim 22 wherein the filler material is chosen from one of SiO2, SiN, barrier metals including Ti, Ta, W, TiN, TaN, and a metal.

* * * * *

UNITED STATES PATENT AND TRADEMARK OFFICE
CERTIFICATE OF CORRECTION

PATENT NO. : 10,256,822 B2  
APPLICATION NO. : 15/956692  
DATED : April 9, 2019  
INVENTOR(S) : Jonathan Greene et al.

Page 1 of 1

It is certified that error appears in the above-identified patent and that said Letters Patent is hereby corrected as shown below:

On the Title Page

On the first line of Item (62) titled "Related U.S. Application Data" after the word "Division" insert --of application No. 14/835,928, filed on Aug. 26, 2015, now Pat. No. 9,991,894 which is a division--

On the ninth, tenth and eleventh lines of Item (62) titled "Related U.S. Application Data" delete the phrase ", application No. 15/956,692, filed on Apr. 18, 2018, which is a division of application No. 14/835,928, filed on Aug. 26, 2015, now Pat. No.9,991,894"

Signed and Sealed this  
Eighteenth Day of June, 2019

Andrei Iancu  
*Director of the United States Patent and Trademark Office*